(12) United States Patent
Remple

(10) Patent No.: US 10,491,205 B2
(45) Date of Patent: Nov. 26, 2019

(54) COMPARATOR FOR GLOBALLY DISTRIBUTED REGULATORS

(71) Applicant: QUALCOMM Incorporated, San Diego, CA (US)

(72) Inventor: Terrence Brian Remple, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 29 days.

(21) Appl. No.: 15/844,211

(22) Filed: Dec. 15, 2017

(65) Prior Publication Data

US 2019/0190507 A1    Jun. 20, 2019

(51) Int. Cl.
| | |
|---|---|
| *H03K 5/24* | (2006.01) |
| *G05F 1/565* | (2006.01) |
| *G05F 1/575* | (2006.01) |
| *G06F 1/32* | (2019.01) |
| *H02J 1/14* | (2006.01) |
| *H02J 9/06* | (2006.01) |

(52) U.S. Cl.
CPC ........... *H03K 5/2481* (2013.01); *G05F 1/565* (2013.01); *G05F 1/575* (2013.01); *G06F 1/32* (2013.01); *H02J 1/14* (2013.01); *H02J 9/062* (2013.01)

(58) Field of Classification Search
CPC ....... H03K 5/2481; G05F 1/565; G05F 1/575; G06F 1/32; H02J 1/14; H02J 9/062
USPC ................................ 327/307, 50–57, 63–67
See application file for complete search history.

(56) References Cited

U.S. PATENT DOCUMENTS

| | | | |
|---|---|---|---|
| 6,320,426 B1* | 11/2001 | Shih ................. | H03K 3/356139 327/65 |
| 6,614,301 B2* | 9/2003 | Casper ................ | H03F 3/45654 327/307 |
| 6,977,491 B1 | 12/2005 | Caldwell et al. | |
| 7,132,861 B1* | 11/2006 | Fu ........................ | H03F 3/45744 327/52 |
| 7,609,047 B2 | 10/2009 | Ravichandran | |
| 8,988,111 B2* | 3/2015 | Rysinski ............. | H03F 3/45188 327/58 |

(Continued)

FOREIGN PATENT DOCUMENTS

| | | |
|---|---|---|
| WO | 2017023473 A1 | 2/2017 |
| WO | 2017034795 A1 | 3/2017 |

OTHER PUBLICATIONS

International Search Report and Written Opinion—PCT/US2018/059526—ISA/EPO—Jan. 25, 2019.

*Primary Examiner* — Tomi Skibinski
(74) *Attorney, Agent, or Firm* — Loza & Loza, LLP/Qualcomm

(57) ABSTRACT

A method for offset calibration of a voltage comparator is disclosed according to certain aspects of the present disclosure. The method includes applying a first bias voltage to a gate of a first compensation transistor, wherein the first compensation transistor is coupled in series with a first input transistor of the voltage comparator. The method also includes applying a second bias voltage to a gate of a second compensation transistor, wherein the second compensation transistor is coupled in series with a second input transistor of the voltage comparator. The method further includes sensing a logic value at an output of the voltage comparator, and adjusting the first bias voltage and the second bias voltage based on the sensed logic value.

22 Claims, 25 Drawing Sheets

(56) References Cited

U.S. PATENT DOCUMENTS

| | | | |
|---|---|---|---|
| 10,177,660 B1* | 1/2019 | Remple | G05F 1/565 |
| 2001/0043088 A1* | 11/2001 | Nikhade | H03K 5/2481 |
| | | | 327/66 |
| 2003/0030579 A1 | 2/2003 | Koo et al. | |
| 2004/0247066 A1* | 12/2004 | Suda | H03L 7/0814 |
| | | | 375/376 |
| 2007/0182458 A1 | 8/2007 | Park et al. | |
| 2012/0119790 A1* | 5/2012 | Chen | H03K 5/249 |
| | | | 327/65 |
| 2013/0335114 A1 | 12/2013 | Chen et al. | |
| 2014/0077780 A1 | 3/2014 | Teong et al. | |
| 2014/0111173 A1 | 4/2014 | Lee | |
| 2014/0132307 A1* | 5/2014 | Chan | H03K 5/22 |
| | | | 327/64 |
| 2014/0176193 A1* | 6/2014 | De Vita | H03K 5/2481 |
| | | | 327/56 |
| 2014/0253359 A1* | 9/2014 | Niwa | H03M 1/1023 |
| | | | 341/172 |
| 2015/0311875 A1* | 10/2015 | Chen | G11C 7/065 |
| | | | 327/52 |
| 2015/0358006 A1* | 12/2015 | Chen | H03K 5/003 |
| | | | 327/307 |
| 2016/0098050 A1 | 4/2016 | Enjalbert et al. | |
| 2016/0187900 A1 | 6/2016 | Dhiman et al. | |
| 2016/0342165 A1 | 11/2016 | Rosen et al. | |
| 2017/0052552 A1 | 2/2017 | Mahmoudi et al. | |

* cited by examiner

| Vblk_Hi | Vblk_Rise | Count Value |
|---|---|---|
| 0 | 0 | Increment |
| 0 | 1 | Hold |
| 1 | 0 | Hold |
| 1 | 1 | Decrement |

FIG. 6

COMPARATOR FOR GLOBALLY DISTRIBUTED REGULATORS

BACKGROUND

Field

Aspects of the present disclosure relate generally to comparators, and more particularly to reducing offset voltages in comparators.

Background

It is common for multiple circuit blocks (e.g., processors) on a chip to receive power from a common supply rail, in which each circuit block is coupled to the supply rail via a respective head switch. When a circuit block is active, the respective head switch is turned on, providing a low impedance path between the supply rail and the block. In this case, the voltage at the block is approximately equal to the supply voltage on the supply rail. When a circuit block is inactive, the respective head switch may be turned off to conserve power.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a method for offset calibration of a voltage comparator. The method includes applying a first bias voltage to a gate of a first compensation transistor, wherein the first compensation transistor is coupled in series with a first input transistor of the voltage comparator. The method also includes applying a second bias voltage to a gate of a second compensation transistor, wherein the second compensation transistor is coupled in series with a second input transistor of the voltage comparator. The method further includes sensing a logic value at an output of the voltage comparator, and adjusting the first bias voltage and the second bias voltage based on the sensed logic value.

A second aspect relates to an offset-compensation system. The offset-compensation system includes a first compensation transistor coupled in series with a first input transistor of a voltage comparator, and a second compensation transistor coupled in series with a second input transistor of the voltage comparator. The offset-compensation system also includes a bias generator configured to generate a first bias voltage and a second bias voltage, wherein the first bias voltage is applied to a gate of the first compensation transistor, and the second bias voltage is applied to a gate of the second compensation transistor. The offset-compensation system also includes an offset controller configured to sense a logic value at an output of the voltage comparator, and to instruct the bias generator to adjust the first bias voltage and the second bias voltage based on the sensed logic value.

A third aspect relates to an offset-compensation system. The offset-compensation system includes a first compensation transistor coupled in series with a first input transistor of a voltage comparator, and a second compensation transistor coupled in series with a second input transistor of the voltage comparator. The offset compensation-system also includes a bias generator configured to generate a first bias voltage and a second bias voltage, wherein the first bias voltage is applied to a gate of the first compensation transistor, and the second bias voltage is applied to a gate of the second compensation transistor. The offset-compensation system further includes an offset controller. For each one of multiple calibration steps, the offset controller is configured to sense a logic value at an output of the voltage comparator, and instruct the bias generator to adjust the first bias voltage and the second bias voltage based on the sensed logic value for the calibration step.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

BRIEF DESCRIPTION OF THE DRAWINGS

FIG. 6 shows an example of a truth table illustrating operations of a controller according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A processor in a System on a Chip (SoC) often performs multiple tasks in sequence, in which the latency requirements of the tasks may vary. When the processor performs a task with a long latency requirement, the clock speed of the processor may be reduced. When the processor performs a task with a short latency requirement, the clock speed may need to be increased in order to perform the task. Thus, the clock speed of the processor may vary according to the latency requirements of the tasks being performed by the processor.

When the clock speed is low, the supply voltage of the processor may be reduced to reduce the energy consumed per clock cycle. This is because the low clock speed allows transistors in the processor to operate at lower switching speeds, and therefore a lower supply voltage. When the clock speed is high, the voltage supply needs to be increased to increase the switching speeds of the transistors. In this regard, the supply voltage of the processor may be dynamically scaled (adjusted) according to the clock speed of the processor in a technique referred to as Dynamic Clock and Voltage Scaling (DCVS). This technique may also be referred as Dynamic Voltage and Frequency Scaling (DVFS).

Reducing the supply voltage reduces the amount of energy needed to perform a task. This is because reducing the supply voltage reduces the amount of energy per clock cycle while not changing the number of clock cycles needed to perform the task.

The benefit of DCVS may be diminished when multiple processors share the same supply rail. This is because the supply voltage on the supply rail needs to be set high enough to support the processor with the highest clock speed. As a result, the supply voltage is higher than needed for processors with lower clock speeds, resulting in wasted energy.

Figure 1:
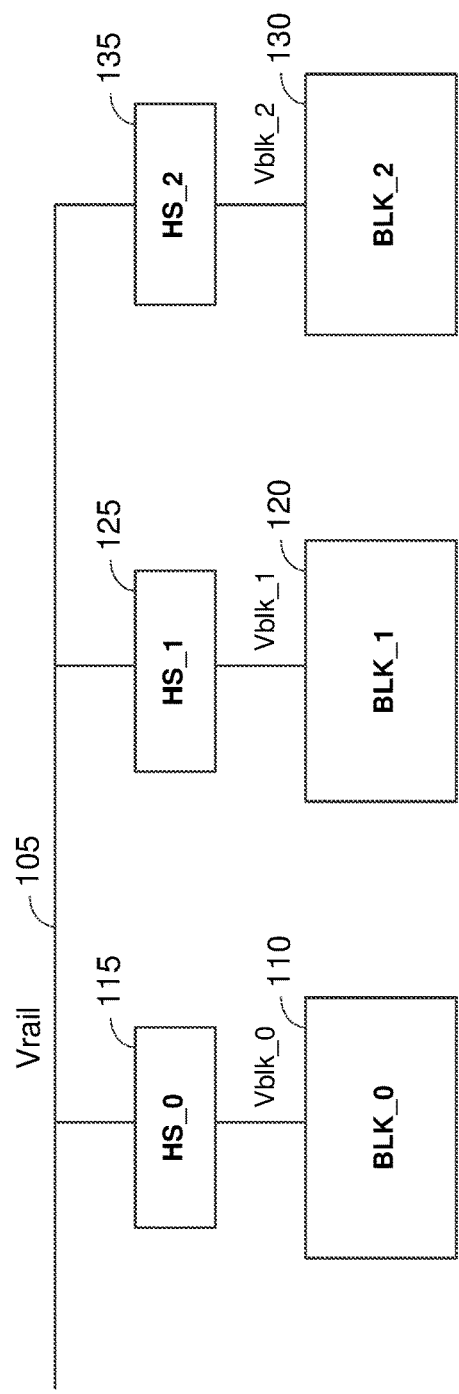
FIG. 1 shows an example of multiple circuit blocks sharing a common supply rail via multiple head switches according to certain aspects of the present disclosure.

FIG. 1 shows an example of multiple circuit blocks 110, 120 and 130 (e.g., multiple processors) sharing a common supply rail 105. In this example, the circuit blocks 110, 120 and 130 (e.g., processors) are coupled to the supply rail 105 through head switches (HS) 115, 125 and 135, respectively. When a circuit block is active, the respective head switch is turned on, providing a low impedance (e.g., several milliohms) path between the supply rail 105 and the block. In this case, the voltage at the block is approximately equal to the supply voltage (denoted "Vrail") on the supply rail 105. When a circuit block is inactive, the respective head switch may be turned off to conserve energy.

Assuming all of the circuit blocks 110, 120 and 130 are active, if block 110 has a higher clock speed than blocks 120 and 130, then the supply voltage on the supply rail 105 is set high enough (e.g., by a power management integrated circuit (PMIC)) to support the clock speed of block 110. As a result, the supply voltage on the supply rail 105 is higher than needed for blocks 120 and 130, which operate at lower clock speeds than block 110. This results in wasted energy.

Therefore, in the above approach, the supply voltage of all of the blocks is dictated by the block with the highest clock speed (e.g., block 110), resulting in wasted energy for blocks operating at lower clock speeds (e.g., blocks 120 and 130).

Aspects of the present disclosure address the above problem by replacing the head switches 115, 125 and 135 in FIG. 1 with digital sub-regulators (DSRs). The DSRs allow the supply voltage of each block to be independently set to a voltage below the supply voltage Vrail on the supply rail 105. Thus, if the supply voltage Vrail on the supply rail is set according to the block with the highest clock speed, then the supply voltage for each block operating at a lower clock speed can be set to a voltage below the supply voltage Vrail on the supply rail 105 by the respective DSR. This reduces energy consumption, as discussed further below.

Figure 2:
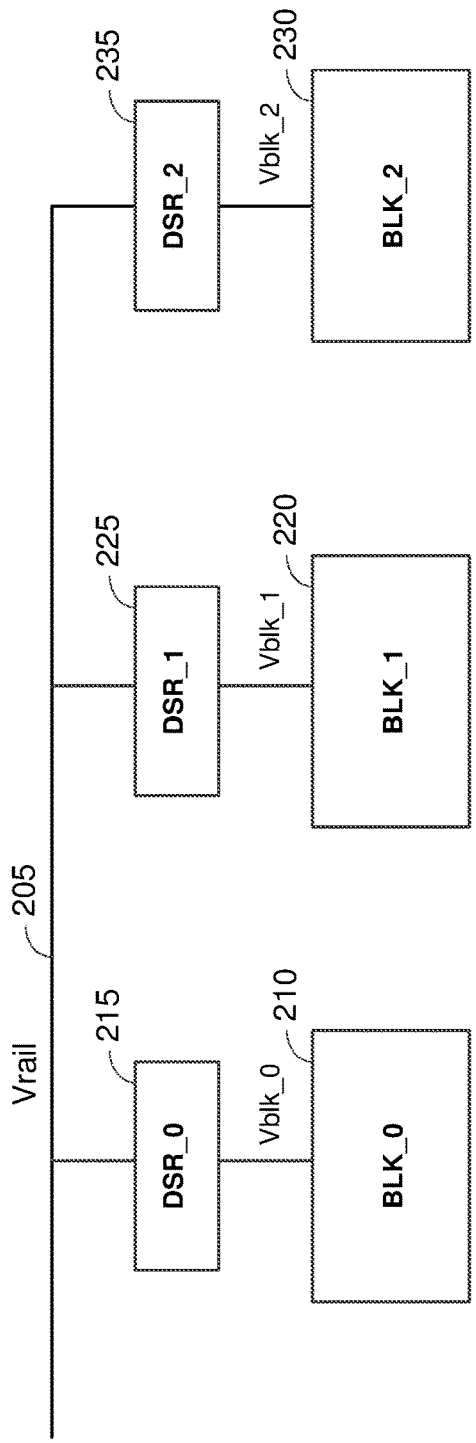
FIG. 2 shows an example of multiple circuit blocks sharing a common supply rail via multiple regulators according to certain aspects of the present disclosure.

FIG. 2 below shows an example of multiple circuit blocks 210, 220 and 230 (e.g., processors) sharing a common supply rail 205. In this example, the circuit blocks 210, 220 and 230 (e.g., processor) are coupled to the supply rail 205 through digital sub-regulators (DSRs) 215, 225 and 235, respectively. Each DSR allows the supply voltage of the respective block to be independently set to a supply voltage below the supply voltage Vrail on the supply rail 205.

For example, if block 210 has the highest clock speed, then the supply voltage Vrail on the supply rail 205 may be set high enough (e.g., by a PMIC) to support the clock speed of block 210. If each of blocks 220 and 230 operates at a lower clock speed than block 210, then the supply voltages of blocks 220 and 230 (denoted "Vblk_1" and "Vblk_2") may be set lower than the supply voltage Vrail by the respective DSRs 225 and 235. Thus, the supply voltages of blocks 220 and 230 are no longer dictated by the block with the highest clock speed (i.e., block 210 in this example).

The reduced supply voltages of blocks 220 and 230 reduce the amount of energy consumed by these blocks. The amount of energy saved per clock period (cycle) at each of blocks 220 and 230 may be proportional to the difference between the supply voltage Vrail on the supply rail 205 and the supply voltage at the block.

Figure 3:
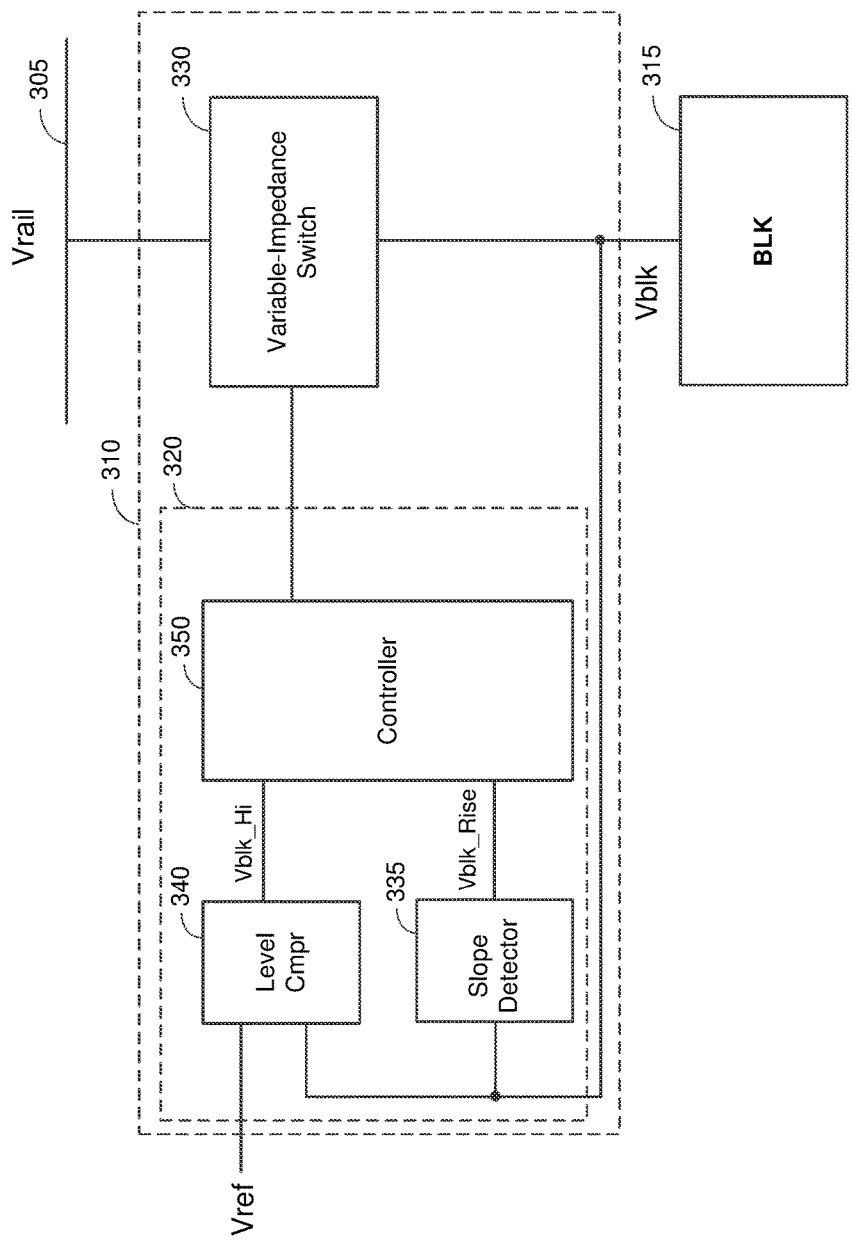
FIG. 3 shows an example of a regulator according to certain aspects of the present disclosure.

FIG. 3 shows an exemplary implementation of a voltage regulator 310 according to some aspects of the present disclosure. The regulator 310 may be used to implement each of the DSRs 215, 225 and 235 shown in FIG. 2. In other words, each of the DSR 215, 225 and 235 in FIG. 2 may be a separate instance (copy) of the regulator 310 shown in FIG. 3.

The regulator 310 is coupled between a supply rail 305 and a circuit block 315 (e.g., processor). For example, if the regulator 310 is used to implement DSR 225 in FIG. 2, then the supply rail 305 corresponds to supply rail 205 in FIG. 2 and the circuit block 315 corresponds to circuit block 220 in FIG. 2.

The regulator 310 includes a control circuit 320, and a variable-impedance switch 330. The variable-impedance switch 330 is coupled between the supply rail 305 and the circuit block 315. The variable-impedance switch 330 has an adjustable (tunable) impedance that is set by a control signal from the control circuit 320. Since the variable-impedance switch 330 is coupled between the supply rail 305 and the circuit block 315, the variable-impedance switch 330 allows the control circuit 320 to control the impedance between the supply rail 305 and the circuit block 315 by controlling the impedance of the variable-impedance switch 330, as discussed further below.

In some aspects, the variable-impedance switch 330 includes multiple pass field effect transistors (FETs) coupled in parallel between the supply rail 305 and the circuit block 315. In these aspects, the control circuit 320 adjusts the impedance of the variable-impedance switch 330 by adjusting the number of pass FETs that are turned on, as discussed further below.

In operation, the control circuit 320 compares the block voltage (denoted "Vblk") with a reference voltage (denoted "Vref") corresponding to a desired (target) block voltage. The control circuit 310 controls the impedance of the variable-impedance switch 330 based on the comparison to keep the block voltage Vblk close to the reference voltage Vref, as discussed further below.

In the exemplary implementation shown in FIG. 3, the control circuit 320 includes a voltage level comparator 340, a slope detector 335, and a controller 350. The controller 350 is configured to increase, decrease or hold the impedance of the variable-impedance switch 330 based on the output signal of the level comparator 340 and the output signal of the slope detector 335, as discussed further below. The controller 350 holds the impedance of the variable-impedance switch 330 by keeping the current impedance setting of the variable-impedance switch 330.

The level comparator 340 receives the block voltage Vblk and the reference voltage Vref, compares the block voltage Vblk with the reference voltage Vref, and outputs a signal to the controller 350 indicating whether the block voltage Vblk is higher or lower than the reference voltage Vref. In FIG. 3, the output signal of the level comparator 340 is labeled "Vblk_Hi." In some aspects, the logic state of the output signal Vlbk_Hi indicates whether the block voltage Vblk is higher than or lower than the reference voltage Vref. For example, the output signal Vlbk_Hi may be logic one if the block voltage Vblk is higher than the reference voltage Vref, and logic zero if the block voltage Vblk is lower than the reference voltage Vref.

The slope detector 335 receives the block voltage Vblk, detects whether the block voltage Vblk is rising or falling (i.e., increasing or decreasing), and outputs a signal to the controller 350 indicating whether the block voltage is rising or falling. The slope detector 335 may detect whether the block voltage is rising or falling by sampling the voltage level of the block voltage Vblk using a sampling clock (not shown in FIG. 3). In this example, the slope detector 335 uses a high-pass filter to generate a high-pass filtered version of the block voltage Vblk, and looks at the high-pass filtered version of the block voltage Vblk to determine whether the block voltage Vblk is rising or falling. The high-pass filter acts as a differentiator that outputs a positive offset when the input is rising, and outputs a negative offset when the input is falling.

In FIG. 3, the output signal of the slope detector 335 is labeled "Vblk_Rise." In some aspects, the logic state of the output signal Vlbk_Rise indicates whether the block voltage is rising or falling. For example, the output signal Vlbk_Rise may be logic one if the block voltage is rising, and logic zero if the block voltage is falling.

The controller 350 receives the output signal Vblk_Hi of the level comparator 340 and the output signal Vblk_Rise of the slope detector 335, and controls the impedance of the variable-impedance switch 330 based on the output signals Vblk_Hi and Vblk_Rise. If the output signals indicate that the block voltage Vblk is lower than the reference voltage Vref and falling, then the controller 350 decreases the impedance of the variable-impedance switch 330 to raise the block voltage Vblk. On the other hand, if the output signals indicate that the block voltage Vblk is higher than the reference voltage Vref and rising, then the controller 350 increases the impedance of the variable-impedance switch 330 to reduce the block voltage Vblk.

If the output signals indicate that the block voltage Vblk is lower than the reference voltage Vref and rising, then the controller 350 holds (i.e., does not change) the impedance of the variable-impedance switch 330. In this case, the impedance of the variable-impedance switch 330 is not changed because the block voltage Vblk is already heading in the right direction to reduce the difference between the block voltage Vblk and the reference voltage Vref.

If the output signals indicate that the block voltage Vblk is higher than the reference voltage Vref and falling, then the controller 350 holds (i.e., does not change) the impedance of the variable-impedance switch 330. In this case, the impedance of the variable-impedance switch 330 is not changed because the block voltage Vblk is already heading in the right direction to reduce the difference between the block voltage Vblk and the reference voltage Vref.

Thus, the controller 350 holds the impedance of the variable-impedance switch 330 when the block voltage Vblk is lower than the reference voltage Vref and rising, and when the block voltage Vblk is higher than the reference voltage Vref and falling. This reduces (dampens) oscillation of the block voltage Vblk about the reference voltage Vref, thereby making the block voltage Vblk more stable, as discussed further below.

When the block voltage Vblk drops below the reference voltage Vref, the controller 350 responds to the voltage drop by reducing the impedance of the variable-impedance switch 330. At some point, the reduction in the impedance of the variable-impedance switch 330 causes the block voltage Vblk to start rising back towards the reference voltage Vref.

When this occurs, the controller 350 holds the impedance of the variable-impedance switch 330. If instead the controller 350 were to continue to decrease the impedance of the variable-impedance switch 330, then the controller 350 may overcompensate the impedance of the variable-impedance switch 330, causing the block voltage Vblk to overshoot the reference voltage Vref by a large magnitude. Holding the impedance of the variable-impedance switch 330 when the block voltage Vblk is lower than the reference voltage Vref and rising reduces the voltage overshoot.

When the block voltage Vblk rises above the reference voltage Vref, the controller 350 responds by increasing the impedance of the variable-impedance switch 330. At some point, the increase in the impedance of the variable-impedance switch 330 causes the block voltage Vblk to start falling back towards the reference voltage Vref. When this occurs, the controller 350 holds the impedance of the variable-impedance switch 330. If instead the controller 350 were to continue to increase the impedance of the variable-impedance switch 330, then the controller 350 may overcompensate the impedance of the variable-impedance switch 330, causing the block voltage Vblk to undershoot the reference voltage Vref by a large magnitude. Holding the impedance of the variable-impedance switch 330 when the block voltage Vblk is higher than the reference voltage Vref and falling reduces the voltage undershoot.

Thus, holding the impedance of the variable-impedance switch 330 when the block voltage Vblk is lower than the reference voltage Vref and rising reduces large voltage overshoots, and holding the impedance of the variable switch 330 when the block voltage Vblk is higher than the reference voltage Vref and falling reduces large voltage undershoots. As a result, oscillation of the block voltage Vblk about the reference voltage Vref is reduced, thereby making the block voltage Vblk more stable.

Figure 4:
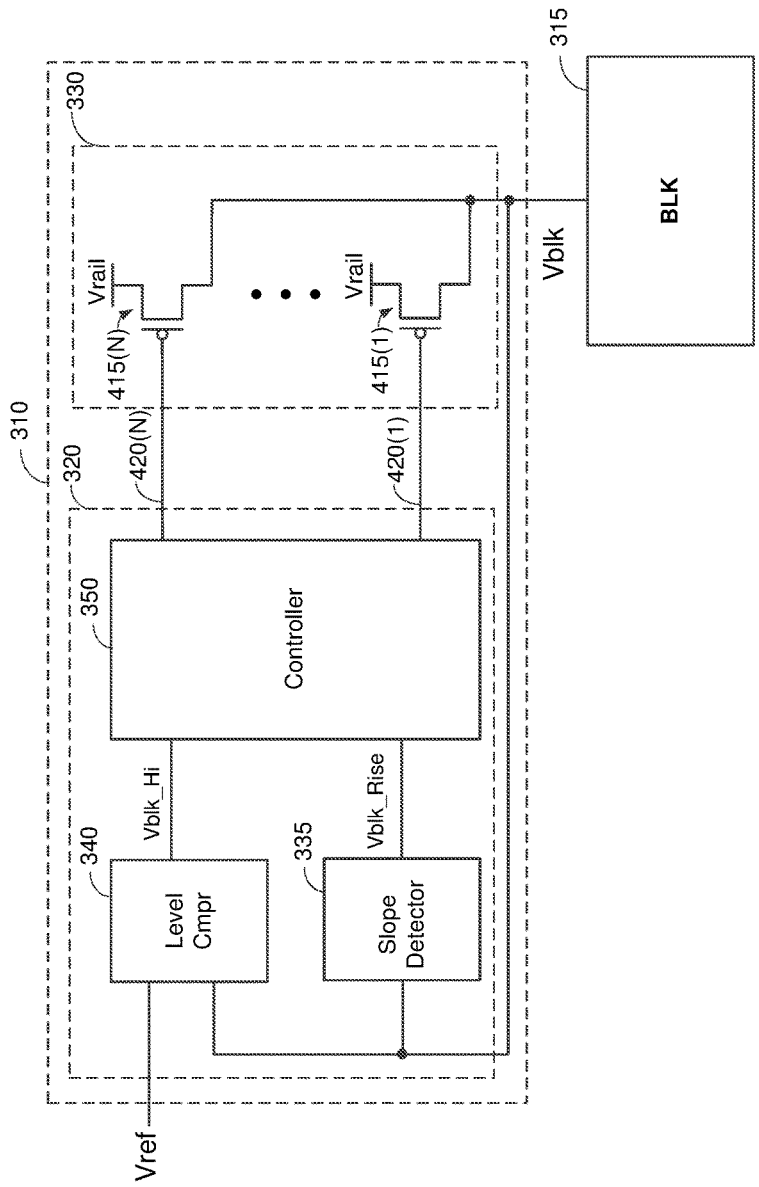
FIG. 4 shows an exemplary implementation of a variable-impedance switch including multiple pass field effect transistors (FETs) according to certain aspects of the present disclosure.

As discussed above, the variable-impedance switch 330 may include multiple pass field effect transistors (FETs) coupled in parallel between the supply rail 305 and the circuit block 315, in which the control circuit 320 adjusts the impedance of the variable-impedance switch 330 by adjusting the number of pass FETs that are turned on. In this regard, FIG. 4 shows an example in which the variable-impedance switch 330 includes multiple pass FETs 415(1) to 415(N) coupled between the supply rail 305 and the circuit block 315. In this example, the controller 350 is coupled to the gate of each of the pass FETs 415(1) to 415(N) by a respective one of multiple control lines 420(1) to 420(N). This allows the controller 350 to individually control the pass FETs 415(1) to 415(N) to adjust the impedance of the variable-impedance switch 330. In the example shown in FIG. 4, each pass FET is implemented with a p-type field effect transistor (PFET). In this example, the controller 350 turns on a particular pass FET by outputting a control signal with a low voltage (e.g., ground) to the gate of the pass FET via the respective control line. The controller 350 turns off a particular pass FET by outputting a control signal with a high voltage (e.g., Vrail) to the gate of the pass FET via the respective control line.

In this example, the controller 350 decreases the impedance of the variable-impedance switch 330 by increasing the number of the pass FETs 415(1) to 415(N) that are turned on. The lower impedance raises the block voltage Vblk for a given load current. The controller 350 increases the impedance of the variable-impedance switch 330 by decreasing the number of the pass FETs 415(1) to 415(N) that are turned on. The higher impedance reduces the block voltage Vblk for a given load current.

In operation, the controller 350 controls the number of the pass FETs 415(1) to 415(N) that are turned on (and hence the impedance of the variable-impedance switch 330) based on the output signal Vblk_Hi of the level comparator 340 and the output signal Vblk_Rise of the slope detector 335. If the output signals indicate that the block voltage Vblk is lower than the reference voltage Vref and falling, then the controller 350 increases the number of the pass FETs 415(1) to 415(N) that are turned on to raise the block voltage Vblk. On the other hand, if the output signals indicate that the block voltage Vblk is higher than the reference voltage Vref and rising, then the controller 350 decreases the number of the pass FETs 415(1) to 415(N) that are turned on to reduce the block voltage Vblk.

If the output signals indicate that the block voltage Vblk is lower than the reference voltage Vref and rising, then the controller 350 holds (i.e., does not change) the number of the pass FETs 415(1) to 415(N) that are turned on. Also, if the output signals indicate that the block voltage Vblk is higher than the reference voltage Vref and falling, then the controller 350 holds (i.e., does not change) the number of the pass FETs 415(1) to 415(N) that are turned on. As discussed above, holding the impedance of the variable-impedance switch 330 when the block voltage Vblk is lower than the reference voltage Vref and rising, and when the block voltage Vblk is higher than the reference voltage Vref and falling reduces (dampens) oscillation of the block voltage Vblk about the reference voltage Vref, thereby making the block voltage Vblk more stable.

Figure 5:
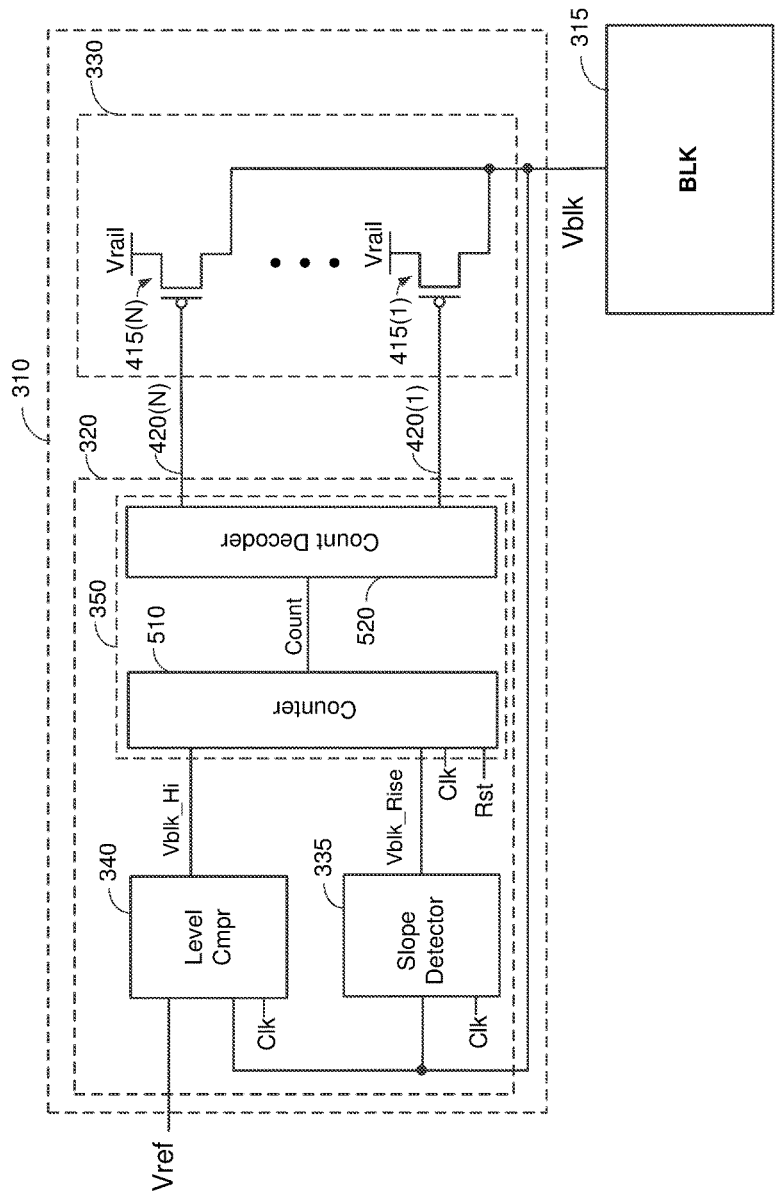
FIG. 5 shows an exemplary implementation of a controller including a counter according to certain aspects of the present disclosure.

FIG. 5 shows an exemplary implementation of the controller 350 according to certain aspects of the present disclosure. In this example, the controller 350 includes a counter 510 and a count decoder 520. The counter 510 is configured to generate a count value based on the output signals of the level comparator 340 and the slope detector 335, and output the count value to the count decoder 520. The count value indicates the number of the pass FETs 415(1) to 415(N) that are to be turned on.

The count decoder 520 receives the count value from the counter 510, and converts the count value into N control signals that turn on the number of the pass FETs 415(1) to 415(N) indicated by the count value. Each of the control signals controls a respective one of the pass FETs 415(1) to 415(N), and is output to the gate of the respective one of the pass FETs 415(1) to 415(N) via the respective control line 420(1) to 420(N). For the example in which the pass FETs 415(1) to 415(N) are implemented with PFETs, the count decoder 520 turns on a FET by outputting a low-voltage control signal (e.g., ground) to the gate of the pass FET, and turns off a pass FET by outputting a high-voltage control signal (e.g., Vrail) to the gate of the pass FET. In this example, if the count value from the counter 510 is one, then the count decoder 520 outputs a low-voltage control signal to the gate of one of the pass FETs and outputs high-voltage control signals to the gates of the remaining pass FETs. In this case, one of the pass FETs is turned on. If the count value from the counter 510 is two, then the count decoder 520 outputs low-voltage control signals to the gates of two of the pass FETs and outputs high-voltage control signals to the gates of the remaining pass FETs. In this case, two of the pass FETs are turned on. In general, in this example, the number of low-voltage control signals equals the count value in order to turn on the number of pass FETs equal to the count value.

As discussed above, the counter 510 generates the count value based on the output signals of the level comparator 340 and the slope detector 335. In this regard, the counter 510 increments the count value if the output signals indicate that the block voltage Vblk is lower than the reference voltage Vref and falling. The counter 510 decrements the count value if the output signals indicate that the block voltage Vblk is higher than the reference voltage Vref and rising. The counter 510 holds the count value (i.e., does not change the count value) if the output signals indicate that the block voltage Vblk is lower than the reference voltage Vref and rising, or the block voltage Vblk is higher than the reference voltage Vref and falling.

FIG. 6 shows an example of a truth table 610 illustrating logical operations of the counter 510 according to certain aspects of the present disclosure. In this example, the output signal Vlbk_Hi of the voltage level comparator 340 is logic one if the block voltage Vblk is higher than the reference voltage Vref, and logic zero if the block voltage Vblk is lower than the reference voltage Vref. Also, the output signal Vlbk_Rise of the slope detector 335 is logic one if the block voltage Vblk is rising, and logic zero if the block voltage Vblk is falling.

As shown in the truth table 610, if the output signals indicate that the block voltage Vblk is lower than the reference voltage Vref and falling (i.e., Vblk_Hi and Vblk_Rise are both zero), then the counter 510 increments the count value. If the output signals indicate that the block voltage Vblk is higher than the reference voltage Vref and rising (i.e., Vblk_Hi and Vblk_Rise are both one), then the counter 510 decrements the count value. If the output signals indicate that the block voltage Vblk is lower than the reference voltage Vref and rising (i.e., Vblk_Hi is zero and Vblk_Rise is one), then the counter holds the count value. Finally, if the output signals indicate that the block voltage is higher than the reference voltage and falling (i.e., Vblk_Hi is one and Vblk_Rise is zero), then the counter 510 holds the count value.

In some aspects, a clock signal (denoted "Clk") is input to the level comparator 340, the slope detector 335 and the counter 510 to time operations of the level comparator 340, the slope detector 335 and the counter 510. In these aspects, the level comparator 340 may compare the block voltage Vlbk with the reference voltage Vref once per period (cycle) of the clock signal Clk and update the output signal Vblk_Hi based on the comparison. Also, the slope detector 335 may determine whether the block voltage Vlbk is rising or falling once per period (cycle) of the clock signal Clk and update the output signal Vblk_Rise based on the determination. Thus, in these aspects, the output signals Vblk_Hi and Vblk_Rise input to the counter 510 are updated once per period (cycle) of the clock signal Clk.

The counter 510 updates the count value once per period of the clock signal Clk based on updates of the output signals Vblk_Rise and Vblk_Hi, and outputs the updated count value to the count decoder 520. As a result, the number of pass FETs 415(1) to 415(N) that are turned on (and hence the impedance of the variable-impedance switch 335) is updated at a rate of once per period of the clock signal Clk. In these aspects, the rate at which the count value is updated is a function of the frequency of the clock signal Clk. The higher the frequency of the clock signal Clk, the shorter the period between updates, and hence the faster the update rate.

Figure 7:
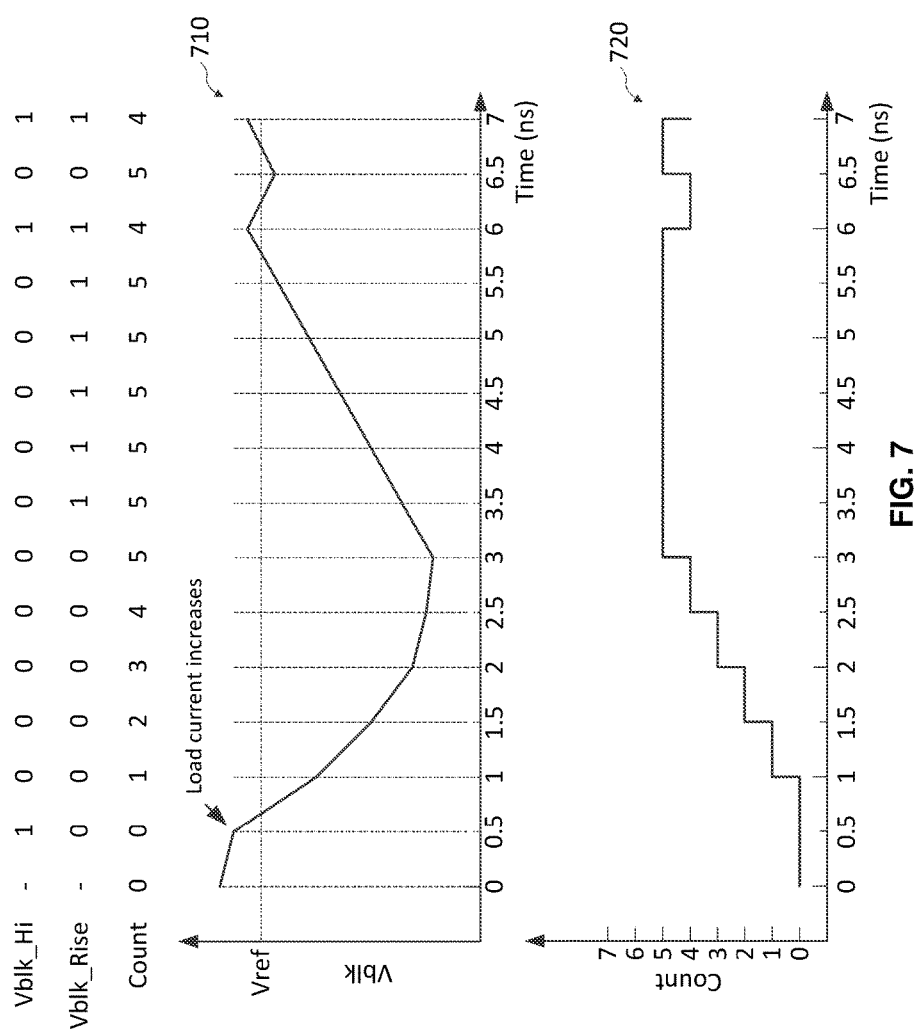
FIG. 7 shows timing diagrams illustrating exemplary operations of a regulator according to certain aspects of the present disclosure.

FIG. 7 shows timing diagrams 710 and 720 illustrating exemplary operations of the regulator 310 according to certain aspects of the present disclosure. In this example, the clock signal Clk has a frequency of 2 GHz. Thus, in this example, the output signal Vblk_Hi of the level comparator 340, the output signal Vblk_Rise of the slope detector 335, and the count value of the counter 510 are updated at a rate of once per 0.5 nanoseconds.

Timing diagram 710 shows the block voltage Vblk over time, and timing diagram 720 shows the count value of the counter 510 over time. In this example, there is a sudden large increase in the load current, causing the block voltage Vblk to drop below the reference voltage Vref. This results in a large droop in the block voltage Vblk, as shown in timing diagram 710. In response to the voltage droop, the counter 510 increments the count value every 0.5 nanoseconds until the count value reaches five, as shown in timing diagram 720. During this time, the output signals Vblk_Hi and Vblk_Rise indicate that the block voltage Vblk is below the reference voltage Vref and falling (i.e., Vblk_Hi and Vblk_Rise are both zero).

The increase in the count value increases the number of pass FETs that are turned on, and hence reduces the impedance of the variable-impedance switch 330. The reduction in the impedance of the variable-impedance switch 330 causes the block voltage Vblk to start rising back to the reference voltage Vref, as shown in timing diagram 710. As the block voltage Vblk rises back to the reference voltage Vref, the counter 510 holds the count value at five, as shown in timing diagram 720. During this time, the output signals Vblk_Hi and Vblk_Rise indicate that the block voltage Vblk is below the reference voltage Vref and rising (i.e., Vblk_Hi is zero and Vblk_Rise is one). After the block voltage Vblk reaches the reference voltage Vref, the count value toggles between four and five to keep the block voltage close to the reference voltage Vref.

In FIG. 7, at times 6 ns, 6.5 ns, and 7 ns, the regulator 310 adjusts the impedance of the variable-impedance switch 330 such that the block voltage Vblk alternates between being slightly above the reference voltage Vref and being slightly below the reference voltage Vref on each clock cycle. This is accomplished by making the response time of the regulator 310 less than one clock cycle such that, when the voltage level comparator and the slope detector sample the block voltage during a clock cycle, the controller 350 is able to adjust the impedance of the variable-impedance switch 330 based on the sampled block voltage before the next clock cycle. This way, the sample of the block voltage during the next clock cycle reflects the change in the block voltage caused by the adjustment in the impedance of the variable-impedance switch 330.

In certain aspects, the counter 510 may be reset to a predetermined count value by asserting a reset signal (denoted "Rst") input to a reset input of the counter 510. The counter 510 may be reset to a count value of zero, or another predetermined count value. After the counter 510 is reset, the count value of the counter 510 may be incremented and/or decremented based on the output signal Vblk_Hi of the level comparator 340 and the output signal Vblk_Rise of the slope detector 335, as discussed above.

In order to quickly respond to a large voltage droop (e.g., due to a sudden increase in the load current), it is desirable for the regulator 310 to quickly change the impedance of the impedance-variable switch 330 by a large amount. This may be accomplished replacing the multiple pass FETs 415(1) to 415(N) with a single large pass FET. The large pass FET enables the impedance of the impedance-variable switch 330 to be changed by a large amount within one clock period. However, the large pass FET has a much larger gate capacitance than each of the multiple pass FETs 415(1) to 415(N). As a result, the dynamic power needed to switch the large pass FET is significantly larger than the dynamic power needed to switch each of the multiple pass FETs 415(1) to 415(N). Thus, a regulator using a single large pass FET consumes significantly more power per clock cycle, which can eliminate the power savings provided by the regulator.

The power of the regulator 310 may be reduced by increasing the number of pass FETs in the variable-impedance switch 330 and reducing the size of each pass FET. However, this increases the response time of the regulator to a large voltage droop. For example, if the controller 310 turns on one pass FET per clock period (cycle), then the controller 310 requires a large number of clock periods (cycles) to turn on a larger number of pass FETs in response to the large voltage droop. If the number of pass FETs is too large, then the regulator may not be able to respond fast enough to the voltage droop to prevent the voltage droop from causing timing violations in the block circuit 315.

Thus, in the above example, there is a tradeoff between regulator operating power and regulator response time. Increasing the number of pass FETs in the variable-impedance switch 330 and reducing the size of each pass FET reduces the power of the regulator at the expense of slower response time to a large voltage droop. Thus, it is desirable to choose a number of pass FETs that provides adequate power savings to justify the additional overhead of the regulator 310 while still providing a fast-enough response time for large voltage droops.

The response time needed for responding to a large voltage droop may be a function of a resonance frequency of a resonance network formed by an inductance of a power distribution network (PDN) that supplies power to the supply rail 305 and a capacitance of the block circuit 315. In this example, it is desirable for the response time of the regulator 310 to a large voltage droop to be equal to or less than half the resonance period of the resonance network. This may be achieved by choosing a number of pass FETs in the variable-impedance switch 330 (i.e., N) such that N times one clock period is less than one-quarter of the resonance period. In one example, the resonance frequency of resonance network may be approximately 70 MHz, which translates into a resonance period of approximately 14 nanoseconds. In this example, it is desirable for the response time of the regulator 310 to a large voltage droop to be less than 3.5 nanoseconds. This can be achieved by using seven pass FETs (i.e., N=7) for a clock period of 0.5 nanoseconds. In this case, the controller 350 is able to transition from the maximum impedance of the variable-impedance switch 330 to the minimum impedance of the variable-impedance switch 330 in seven clock periods, which translates into 3.5 nanoseconds.

In certain aspects, the block circuit 315 may include a processor that sequentially performs two or more tasks with different latency requirements. In this example, an operational state manager (not shown) may dynamically scale the clock frequency and/or block voltage Vblk of the block circuit 315 according to the task being performed by the block circuit 315. For instance, if the block circuit 315 is performing a task with a short latency requirement, then the operational state manager may increase the clock frequency and the block voltage Vblk. On the other hand, if the block circuit 315 is performing a task that does not need to be performed quickly, then the operational state manager may decrease the clock frequency and the block voltage Vblk to conserve power.

In the above example, the operational state manager may set the block voltage Vblk to a target voltage level by setting the reference voltage Vref of the regulator 310 to the target voltage level. This is because the regulator 310 is configured to regulate the block voltage Vblk to maintain the block voltage Vblk close to the reference voltage Vref, as discussed above. The operational state manager may set the clock frequency of the block circuit 315 by setting the frequency of an adjustable clock generator that provides the clock signal to the block circuit 315. The clock signal input to the block circuit 315 may be different from the clock signal Clk input to the level comparator 340, the slope detector 340 and the counter 510 discussed above. Therefore, the clock signal of the block circuit 315 should not be confused with the clock signal Clk discussed above.

In certain aspects, each of the pass FETs 415(1) to 415(N) in the variable-impedance switch 330 has an adjustable size. In these aspects, the size of each of the pass FETs 415(1) to 415(N) may be dynamically scaled according to the clock frequency of the block circuit 315, as discussed further below.

The maximum load current of the block circuit 315 may scale with the clock frequency of the block circuit 315. Generally speaking, the higher the clock frequency, the larger the maximum load current. Thus, the variable-impedance switch 330 needs to be able to handle a larger maximum load current for a higher clock frequency than a lower clock frequency. In this example, the size of each pass FET may be increased for a higher clock frequency to allow the variable-impedance switch 330 to handle the larger maximum load current associated with the higher clock frequency. The size of each pass FET may be decreased for a lower clock frequency since the maximum load current that needs to be handled by the variable-impedance switch 330 is lower for the lower clock frequency. Decreasing the size of each pass FET reduces the power of the regulator 310 since decreasing the size of each pass FET reduces the dynamic power needed to switch each pass FET, as discussed further below. Thus, the size of each pass FET may be decreased for lower clock frequencies to reduce the power of the regulator 310.

Figure 8:
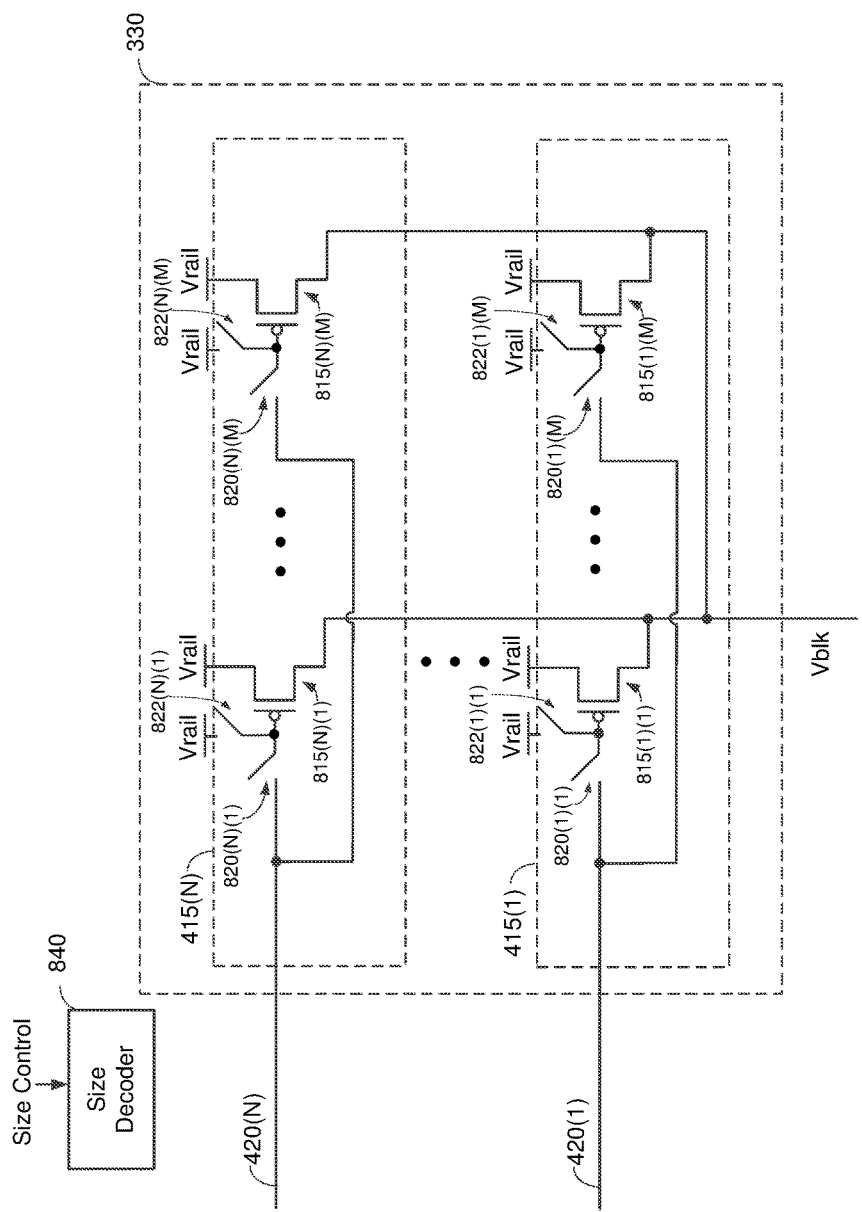
FIG. 8 shows an example of a variable-impedance switch including multiple pass FETs where each pass FET has an adjustable size according certain aspects of the present disclosure.

FIG. 8 shows an exemplary implementation of the variable-impedance switch 330, in which each of the pass FETs 415(1) to 415(N) has an adjustable size. In this example, each of the pass FETs 415(1) to 415(N) includes a respective set of component FETs 815(1)(1) to 815(N)(M). The set of component FETs for each pass FET is coupled between the supply rail and the block circuit 315 (not shown in FIG. 8).

Each of the pass FETs 415(1) to 415(N) also includes a respective set of control switches 820(1)(1) to 820(N)(M), in which each of the control switches is coupled between a gate of a respective one of the component FETs and the respective control line. For example, pass FET 415(1) includes the set of control switches 820(1)(1) to 820(1)(M), in which each of the control switches is coupled between the gate of the respective one of the component FETs 815(1)(1) to 815(1)(M) and control line 420(1), as shown in FIG. 8.

Each of the pass FETs 415(1) to 415(N) also includes a respective set of supply switches 822(1)(1) to 822(N)(M), in which each of the supply switches is coupled between a gate of a respective one of the component FETs and the supply rail. For example, pass FET 415(1) includes the set of supply switches 822(1)(1) to 822(1)(M), in which each of the supply switches is coupled between the gate of the respective one of the component FETs 815(1)(1) to 815(1)(M) and the supply rail, as shown in FIG. 8.

In this example, the regulator 310 includes a size decoder 840 configured to receive a size control signal indicating the size of each pass FET 415(1) to 415(N), and to set the size of each pass FET 415(1) to 415(N) according to the size control signal. The size indicated by the size control signal may be a function of the clock frequency of the circuit block 315, as discussed above.

In operation, the size decoder 840 sets the size of each pass FET 415(1) to 415(N) by controlling the number of the respective component FETs that are coupled to the respective control line. More particularly, for each pass FET 415(1) to 415(N), the size decoder 840 couples a larger number of the respective component FETs to the respective control line for a larger size. The remaining component FETs are decoupled from the respective control lines. Decoupling the remaining component FETs from the respective control lines reduces the power of the regulator 310 since the controller 350 does not waste power driving the gates of these component FETs.

For each component FET that is coupled to the respective control line, the size decoder 840 closes the respective control switch and opens the respective supply switch. Thus, the on/off states of each component FET coupled to the respective control line is controlled by the control signal on the respective control line. Since the size decoder 840 couples a component FET to the respective control line by closing the respective control switch, the size decoder 840 controls the size of each pass FET by controlling the number of the respective control switches that are closed.

For each component FET that is decoupled from the respective control line, the size decoder 840 opens the respective control switch and closes the respective supply switch. In this example, the gate of each component FET that is decoupled from the respective control line is coupled to the supply rail by the respective supply switch. Assuming each component FET is implemented with a PFET, this turns off each component FET that is decoupled from the respective control line. Thus, in this example, each component FET that is decoupled from the respective control line is turned off independent of the control signal on the respective control line.

Although each of the pass FETs 415(1) to 415(N) has an adjustable size in the above example, it is to be appreciated that this need not be the case. For example, a subset of the pass FETs 415(1) to 415(N) may each have an adjustable size.

Figure 9:
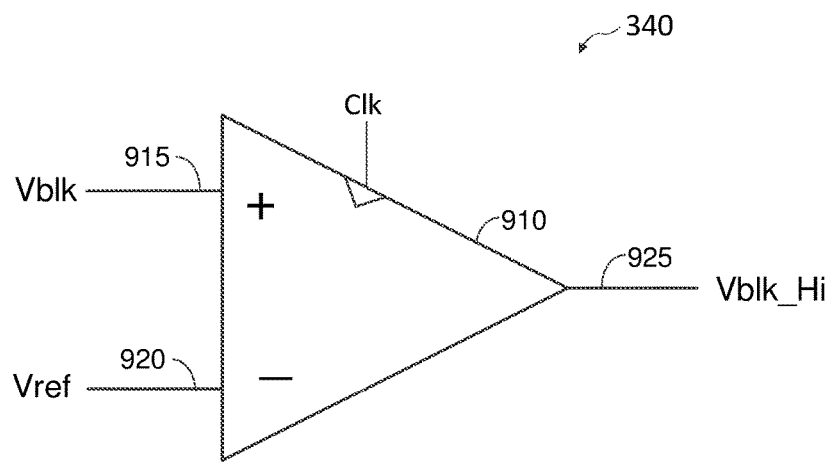
FIG. 9 shows an exemplary implementation of a voltage level comparator according to certain aspects of the present disclosure.

In some aspects, the level comparator 340 may be implemented using a clocked voltage comparator. In this regard, FIG. 9 shows an example in which the level comparator 340 includes a clocked voltage comparator 910. The clocked voltage comparator 910 receives the clock signal Clk for timing operations of the clocked voltage comparator 910. The clocked voltage comparator 910 has a positive input 915, a negative input 920, and an output 925. During each period (cycle) of the clock signal Clk, the comparator 910 compares the voltage at the positive input 915 with the voltage at the negative input 920, and generates an output signal at the output 925 based on the comparison. The output signal is logic one if the voltage at the positive input 915 is higher than the voltage at the negative input 920, and logic zero if the voltage at the positive input 915 is lower than the voltage at the negative input 920. In this example, the output signal of the comparator 910 is updated once per clock period (cycle).

To implement the level comparator 340, the block voltage Vblk is coupled to the positive input 915 of the comparator 910, and the reference voltage Vref is coupled to the negative input 920 of the comparator 910, as shown in FIG. 9. In this configuration, the output 925 of the comparator 910 provides the output signal Vblk_Hi of the level comparator 340, in which the output signal Vblk_Hi is logic one if the block voltage Vblk is higher than the reference voltage Vref, and logic zero if the block voltage Vblk is lower than the reference voltage Vref.

Figure 10:
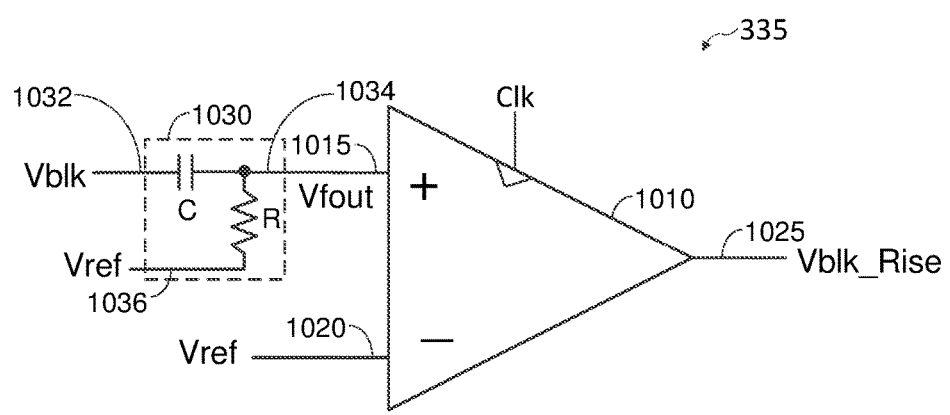
FIG. 10 shows an exemplary implementation of a slope detector according to certain aspects of the present disclosure.

In some aspects, the slope detector 335 may be implemented using a clocked voltage comparator. In this regard, FIG. 10 shows an example in which the slope detector 335 includes a clocked voltage comparator 1010 and a high-pass filter 1030. The clocked voltage comparator 1010 receives the clock signal Clk for timing operations of the clock voltage comparator 1010. The clock voltage comparator 1010 has a positive input 1015, a negative input 1020, and an output 1025. During each period (cycle) of the clock signal Clk, the comparator 1010 compares the voltage at the positive input 1015 with the voltage at the negative input 1020, and generates an output signal at the output 1025 based on the comparison. The output signal is logic one if the voltage at the positive input 1015 is higher than the voltage at the negative input 1020, and logic zero if the voltage at the positive input 1015 is lower than the voltage at the negative input 1020. In this example, the output signal of the comparator 1010 is updated once per clock period (cycle).

The high-pass filter 1030 has a filter input 1032, a filter output 1034, and a bias input 1036. The high-pass filter 130 receives the block voltage Vblk at the filter input 1032, and high-pass filters the block voltage Vblk to generate a filtered output voltage (denoted "Vfout") at the filter output 1034. The reference voltage Vref is applied to the bias input 1036 to bias the filter 1030. In this example, the high-pass filter 1030 acts as a differentiator in which the filtered output voltage Vfout is higher than the reference voltage Vref if the block voltage Vblk is increasing (i.e., rising), and the filtered output voltage Vfout is lower than the reference voltage Vref if the block voltage Vblk is decreasing (i.e., falling). Thus, the filtered output voltage Vfout can be used to determine whether the block voltage Vblk is rising or falling by comparing the filtered output voltage Vfout with the reference voltage Vref, as discussed further below.

In the example shown in FIG. 10, the high-pass filter 1030 includes a capacitor C coupled between the filter input 1032 and the filter output 1034, and a resistor R coupled between the filter output 1034 and the bias input 1036.

To implement the slope detector 335, the filtered output voltage Vfout is coupled to the positive input 1015 of the comparator 1010, and the reference voltage Vref is coupled to the negative input 1020 of the comparator 1010. In this example, the output 1025 of the comparator 1010 provides the output signal Vblk_Rise of the slope detector 335. The output signal Vblk_Rise is logic one when the filtered output voltage Vfout is higher than the reference voltage Vref, which occurs when the block voltage Vblk is rising. The output signal Vblk_Rise is logic zero when the filtered output voltage Vfout is lower than the reference voltage Vref, which occurs when the block voltage Vblk is falling.

In the above example, the slope detector 335 detects the slope of the block voltage Vblk by high-pass filtering the block voltage Vblk. However, it is to be appreciated that the present disclosure is not limited to this example. For example, the slope detector 335 may detect the slope of the block voltage Vblk by sampling the block voltage Vblk using the clock signal Clk, and comparing a current sample of the block voltage Vblk with a previous sample of the block voltage Vblk (i.e., sample of the block voltage Vblk taken during the previous clock cycle). In this example, the slope detector 335 determines that the block voltage Vblk is rising if the current sample of the block voltage is higher than the previous sample of the block voltage, and determines that the block voltage Vblk is falling if the current sample of the block voltage is lower than the previous sample of the block voltage.

In certain aspects, the regulator 310 may include a head switch to enable the regulator 310 to function as a head switch in certain cases. For example, for the case in which the target voltage level for the block voltage Vblk is approximately equal at the supply voltage Vrail of the supply rail 305, the regulator 310 may function as a head switch to provide a low impedance path between the supply rail 305 and the block circuit 315. Voltage regulation is not used in this case since voltage regulation may not provide net power savings in this case. In another example, the regulator 310 may function as a head switch during power up of the block circuit 315 to pre-charge capacitors in the block circuit 315.

Figure 11:
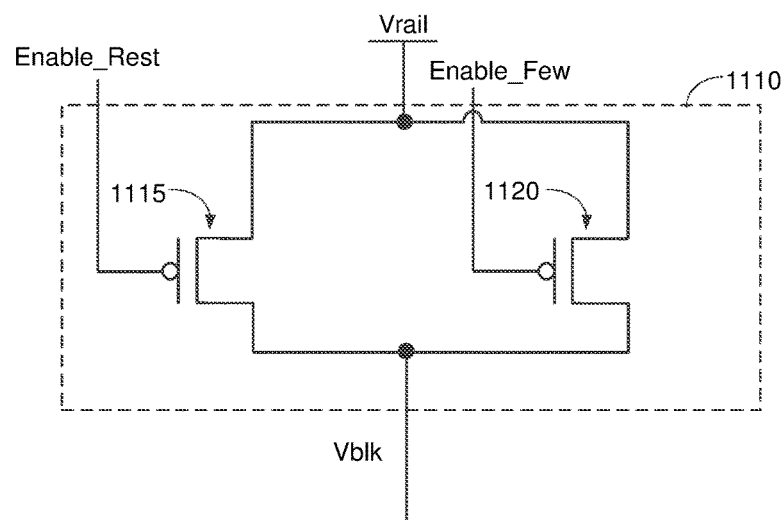
FIG. 11 shows an exemplary implementation of a head switch according to certain aspects of the present disclosure.

FIG. 11 shows an example of a head switch 1110 that may be included in the regulator 310 according to certain aspects of the present disclosure. In this example, the head switch 1110 includes a strong pass FET 1115, and a weak pass FET 1120. The pass FETs 1115 and 1120 are coupled between the supply rail 305 and the block circuit 315 (not shown in FIG. 11). The strong FET 1115 has a low impedance (e.g., several milliohms) when turned on to provide low impedance between the supply rail 305 and the block circuit 315. The weak FET 1120 has a relatively high impedance when turned on compared to the strong FET 1115. This is done to limit the amount of current that flows through the weak FET 1120, as discussed further below. The strong FET 1115 may be physically larger than the weak FET 1120, although this is not explicitly shown in FIG. 11.

The gate of the weak pass FET 1120 is controlled by a control signal labeled "Enable_Few." In the example shown in FIG. 11, the weak pass FET 1120 is implemented with a PFET. Thus, in this example, the Enable_Few signal is high (e.g., Vrail) to turn off the weak FET 1120 and low (e.g., ground) to turn on the weak pass FET 1120.

The gate of the strong pass FET 1115 is controlled by a control signal labeled "Enable_Rest." In the example shown in FIG. 11, the strong pass FET 1125 is implemented with a PFET. Thus, in this example, the Enable_Rest signal is high (e.g., Vrail) to turn off the strong FET 1115 and low (e.g., ground) to turn on the strong pass FET 1115.

As discussed above, the head switch 1110 may be used for power up of the block circuit 315. In this example, at the start of power up, the Enable_Few signal is low and the Enable_Rest signal is high. As a result, the weak FET 1120 is initially turned on with the strong FET 1115 turned off. This allows current to flow from the supply rail 305 to the block circuit 315 through the weak FET 1120 to pre-charge capacitors in the block circuit 315. The weak FET 1120 is used to pre-charge the capacitors to prevent a large inrush current flowing into the block circuit 315, which can cause a large voltage droop on the supply rail 305. If the strong FET 1115 were used instead to pre-charge the capacitors, then a large inrush current would flow from the supply rail 305 to the block circuit 315 due to low impedance of the strong FET 1115 and the initially large voltage difference between the supply rail 305 and the block circuit 315. The relatively high impedance of the weak FET 1120 limits the current flow through the weak FET 1120, thereby preventing the large inrush current. When the capacitors of the block circuit 315 are charged to a voltage close to the supply voltage Vrail, the Enable_Rest signal transitions from high to low to turn on the strong FET 1115. Once turned on, the strong FET 1115 provides a low impedance path between the supply rail 305 and the block circuit 315.

Figure 12:
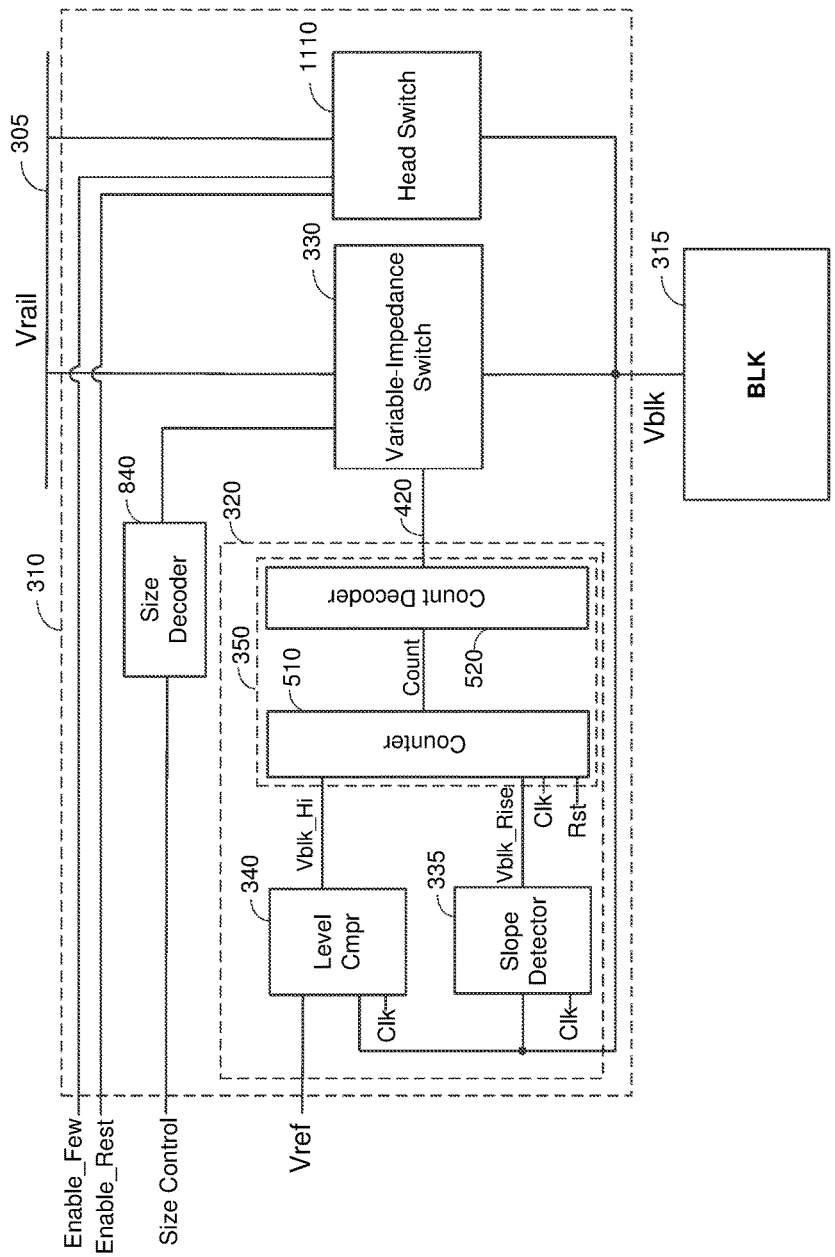
FIG. 12 shows an example of a regulator that can also function as a head switch according to certain aspects of the present disclosure.

FIG. 12 shows an example in which the head switch 1110 is included in the regulator 310. In this example, the regulator 310 may operate in a head-switch mode or a regulation mode. In the head-switch mode, the block circuit 315 is coupled to the supply rail 305 through the head switch 1110. The regulator 310 may operate in the head-switch mode, for example, when the target voltage level for the block voltage Vblk is approximately equal to the supply voltage Vrail of the supply rail 305. In this case, the strong FET 1115 in the head switch 1110 may be turned on using the Enable_Rest signal to provide a low impedance path between the supply rail 305 and the block circuit 315. The regulator 310 may also operate in the head-switch mode to power up the block circuit 315, as discussed above.

In the regulation mode, the block circuit 315 is coupled to the supply rail 305 through the variable-impedance switch 330. In this mode, the control circuit 320 adjusts the impedance of the variable-impedance switch 330 based on feedback of the block voltage Vblk to keep the block voltage Vblk close to the reference voltage Vref, as discussed above. The regulation mode allows the block voltage Vblk to be set to a target voltage below the supply voltage Vrail by setting the reference voltage Vref to the target voltage. The regulation mode may also allow the size of each pass FET 415(1) to 415(N) to be set to a desired size by setting the size control signal accordingly. As discussed above, the size of each pass FET may be scaled according to the clock frequency of the circuit block 315. In the regulation mode, both the weak FET 1120 and the strong FET 1115 may be turned off.

In certain aspects, the regulator 310 may be used to control another regulator, in which the other regulator has less overhead than the regulator 310. In the discussion below, the regulator 310 is referred to as the control regulator 310 and the other regulator being controlled by the regulator 310 is referred to as the ancillary regulator.

Figure 13:
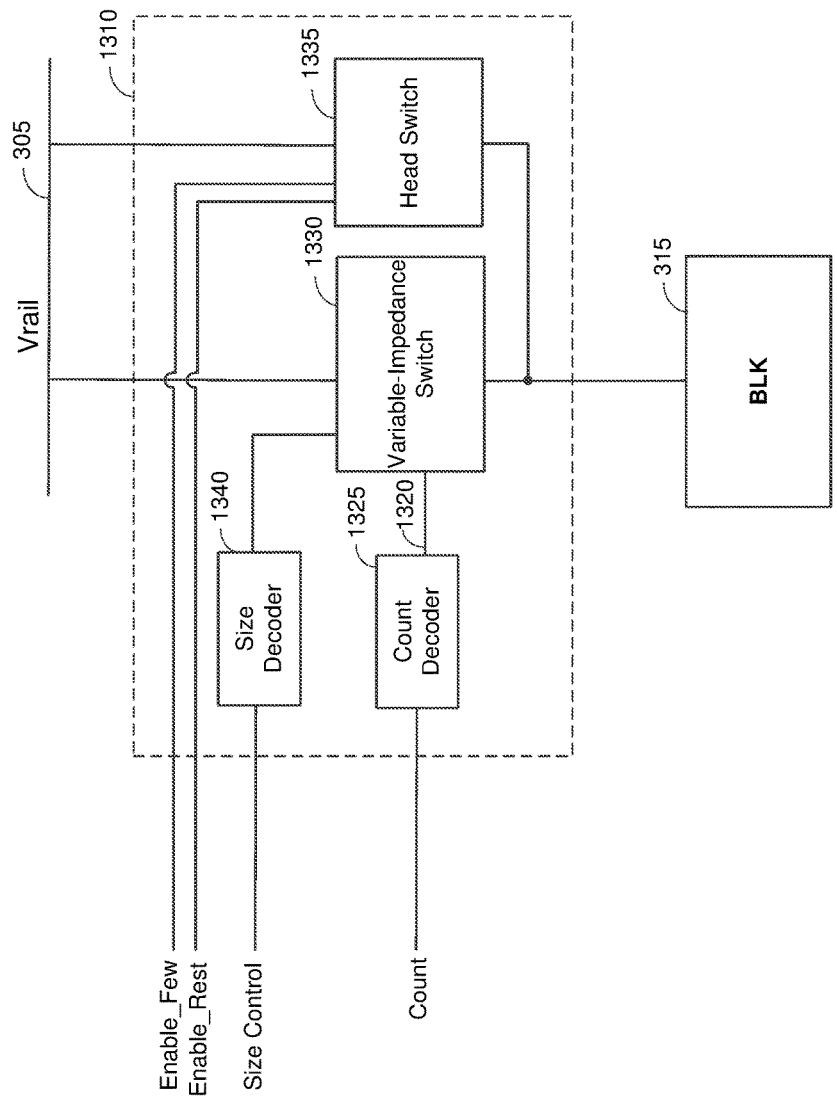
FIG. 13 shows an example of an ancillary regulator according to certain aspects of the present disclosure.

In this regard, FIG. 13 shows an example of an ancillary regulator 1310 that is controlled by the control regulator 310. More particularly, the count value generated by the counter 510 of the control regulator 310 is input to the ancillary regulator 1310 to control voltage regulation by the ancillary regulator 1310, as discussed further below. Since the ancillary regulator 1310 is controlled by the count value from the control regulator 310, the level comparator 340, the slope detector 335 and the counter 510 may be omitted from the ancillary regulator 1310, thereby reducing overhead compared with the control regulator 310.

In the example shown in FIG. 13, the ancillary regulator 1310 includes a variable-impedance switch 1330, a head switch 1335, a count decoder 1325, and a size decoder 1340. The variable-impedance switch 1330 is coupled between the supply rail 305 and the block circuit 315, and may be implemented using the variable-impedance switch 330 shown in FIG. 5. In this example, the variable-impedance switch 1330 includes multiple pass FETs (not shown in FIG. 13), in which the impedance of the variable-impedance switch 1330 is controlled by controlling the number of the pass FETs that are turned on.

The count decoder 1325 receives the count value from the control regulator 310, and converts the count value into control signals 1320 that turn on the number of the pass FETs indicated by the count value. Thus, the number of the pass FETs that are turned on in the variable-impedance switch 1330 (and hence the impedance of the variable-impedance switch 1330) is controlled by the count value from the control regulator 310.

In this example, the variable-impedance switch 1330 has an adjustable pass-FET size, and may be implemented using the exemplary structure shown in FIG. 8. In this regard, the size decoder 1340 receives a size control signal indicating a pass-FET size, and sets the size of each pass FET in the variable-impedance switch 1330 according to the pass-FET size indicated by the size control signal. The size control signal may be the same as the size control signal input to the size decoder 840 of the control regulator 310. Thus, in the example, the control regulator 310 and the ancillary regulator 1310 may have the same pass-FET size setting.

The head switch 1335 is coupled between the supply rail 305 and the block circuit 315, and may be implemented using the head switch 1110 shown in FIG. 11. The head switch 1335 allows the ancillary regulator 1310 to function as a head switch, as discussed above. The strong FET in the ancillary regulator 1310 is controlled by the Enable_Rest signal, and the weak FET in the ancillary regulator 1310 is controlled by the Enable_Few signal.

Figure 14:
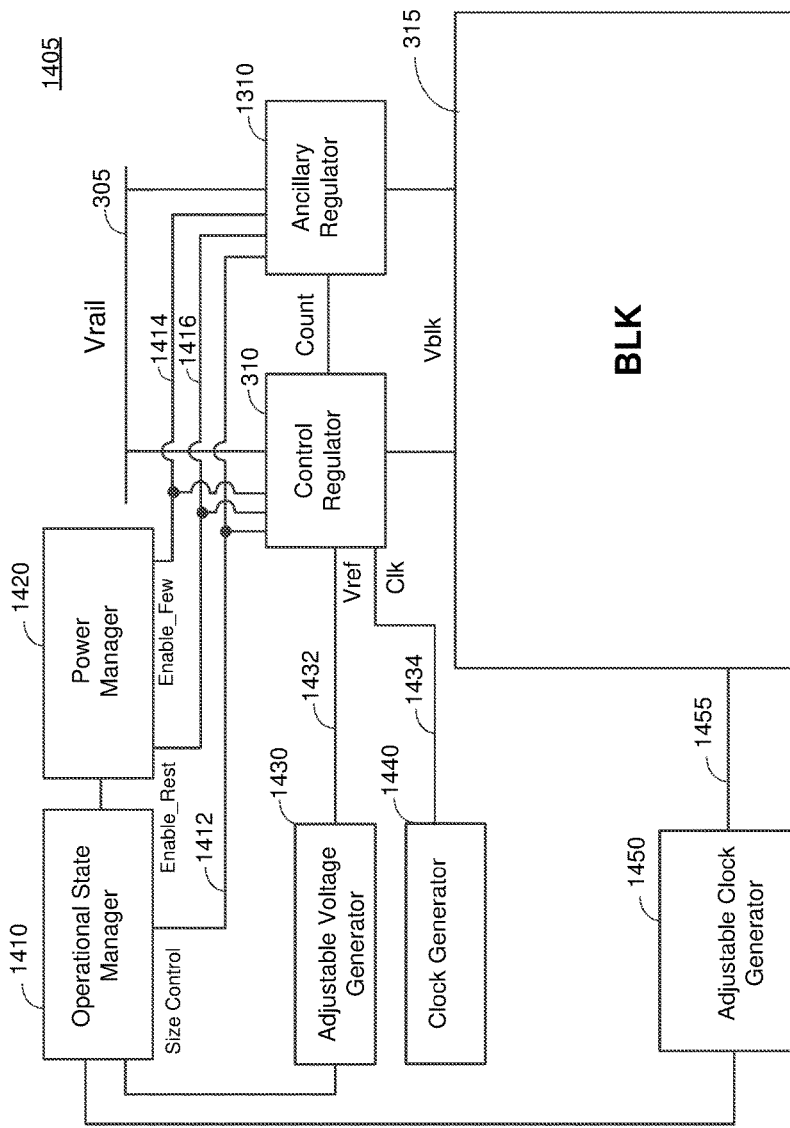
FIG. 14 shows an example of a system including a control regulator and an ancillary regulator according to certain aspects of the present disclosure.

FIG. 14 shows an exemplary system 1405 in which the control regulator 310 and the ancillary regulator 1310 may be used. In this example, the control regulator 1310 and the ancillary regulator 1310 are coupled between the supply rail 305 and the block circuit 315. As shown in FIG. 14, the count value generated by the counter 510 of the control regulator 310 is routed to the ancillary regulator 1310 to control the ancillary regulator 1310.

In this example, the system 1405 includes a clock generator 1440 configured to generate the clock signal Clk for timing the operations of the slope detector 335, the level comparator 340 and the counter 510 in the control regulator 310, as discussed above. The clock signal Clk is routed from the clock generator 1440 to the control regulator 310 via clock line 1434.

The system 1405 also includes an adjustable voltage generator 1430 configured to generate the reference voltage Vref, which is routed from the generator 1430 to the control regulator 310 via voltage line 1432. The adjustable voltage generator 1430 is configured to adjust the voltage level of the reference voltage Vref to adjust the block voltage Vblk of the block circuit 315, as discussed further below. In certain aspects, the control regulator 310 may include a high-pass filter (not shown) between the voltage line 1432 and the level comparator 340 to filter out noise in the reference voltage Vref so that the reference voltage Vref input to the level comparator 340 is clean.

The system 1405 also includes an adjustable clock generator 1450 configured to generate the clock signal for the block circuit 315 (e.g., processor). This clock signal is routed from the adjustable clock generator 1450 to the block circuit 315 via clock line 1455. The adjustable clock generator 1450 is configured to adjust the frequency of the clock signal to adjust the clock frequency of the block circuit 315, as discussed further below.

The system 1405 also includes an operational state manager 1410. The operational state manager 1410 is configured to scale (adjust) the clock frequency and/or block voltage Vblk of the block circuit 315 according to the latency requirements of tasks performed by the block circuit 315. The operational state manager 1410 adjusts the clock frequency by controlling the frequency of the clock signal generated by the adjustable clock generator 1450. The operational state manager 1410 adjusts the block voltage Vblk by adjusting the reference voltage Vref generated by the adjustable voltage generator 1430. The control regulator 310 receives the reference voltage Vref, and regulates the block voltage Vblk to maintain the block voltage Vblk close to the reference voltage Vref. Since the ancillary regulator 1310 is controlled by the control regulator 310, the ancillary regulator 1310 also regulates the block voltage Vblk to maintain the block voltage Vblk close to the reference voltage Vref.

In this example, the block circuit 315 may include a processor that sequentially performs two or more tasks with different latency requirements. In this example, the operational state manager 1410 may monitor the tasks performed by the block circuit 315 and adjust the clock frequency and/or block voltage Vblk of the block circuit 315 according to the latency requirement of the task. For instance, if the block circuit 315 is performing a task with a short latency requirement (e.g., a task that needs to be performed in a short amount of time), then the operational state manager 1410 may increase the clock frequency and the block voltage Vblk by instructing the adjustable clock generator 1450 to increase the clock frequency and instructing the adjustable voltage generator 1430 to increase the reference voltage Vref. On the other hand, if the block circuit 315 is performing a task that does not need to be performed quickly, then the operational state manager may decrease the clock frequency and the block voltage Vblk by instructing the adjustable clock generator 1450 to decrease the clock frequency and instructing the adjustable voltage generator 1430 to decrease the reference voltage Vref.

The operational state manager 1410 may also adjust the pass-FET size of the regulators 310 and 1310 based on the clock frequency of the block circuit 315. In this example, the operational state manager 1410 adjusts the pass-FET size by adjusting the pass-FET size indicated in the size control signal, which is routed to the regulators 310 and 1310 via control line 1412. In operation, the operational state manager 1410 may increase the pass-FET size for a higher clock frequency and decrease the pass-FET size for a lower clock frequency. For example, the operational state manager 1410 may set the pass-FET size to a larger size for a first clock frequency than a second clock frequency, in which the first clock frequency is higher than the second clock frequency.

The system 1405 may also include a power manager 1420 configured to power up the circuit block 315 from an inactive state to an active state. For example, the operational state manager 1410 may instruct the power manager 1420 to power up the circuit block 315 if the circuit block 315 is currently in the inactive state and one or more tasks need to be performed by the circuit block 315. The power manager 1420 generates the Enable_Few signal, which is routed to the control regulator 310 and the ancillary regulator 1310 via control line 1414. The power manager 1420 also generates the Enable_Rest signal, which is routed to the control regulator 310 and the ancillary regulator 1310 via control line 1416.

To power up the circuit block, the power manager 1420 asserts the Enable_Few signal low to turn on the weak FETs in the head switches of the regulators 310 and 1310. This assumes that the weak FETs are implemented with PFETs. In some aspects, the control line 1414 may include one or more delay elements (not shown) between the control regulator 310 and the ancillary regulator 1310 to stagger activation of the weak FETs. As discussed above, the weak FETs are turned on first to pre-charge capacitors in the block circuit 315.

After the capacitors in the block circuit 315 are charged to a voltage close to the supply voltage Vrail, the power manager 1420 asserts the Enable_Rest signal low to turn on the strong FETs in the head switches of the regulator 310 and 1310. In this example, the power manager 1420 may sense a voltage on the circuit block 315 and assert the Enable_Rest signal low when the sensed voltage reaches a threshold voltage close to the supply voltage Vrail. Alternatively, the power manager 1420 may assert the Enable_Rest signal low after a time delay from the time that the Enable_Few signal is asserted low. In some aspects, the control line 1416 may include one or more delay elements (not shown) between the control regulator 310 and the ancillary regulator 1310 to stagger activation of the strong FETs. As discussed above, the strong FETs are turned on to provide low impedance between the supply rail 305 and the block circuit 315.

If the target voltage level for the block voltage Vblk is approximately equal to the supply voltage Vrail, then the operational state manager 1410 may instruct the power manager 1420 to leave the strong FETs turned on. In this case, the regulators 310 and 1310 operate in the head-switch mode.

If the target voltage level for the block voltage Vblk is below the supply voltage Vrail (e.g., by 50 or more millivolts), then the operational state manager 1420 may instruct the power manager 1420 to turn off the strong FETs, and set the reference voltage Vref to the target voltage level. In this case, the regulators 310 and 1310 operate in the regulation mode to regulate the block voltage Vblk based on the reference voltage Vref.

Although FIG. 14 shows one ancillary regulator 1310 for ease of illustration, it is to be appreciated that the control regulator 310 may control multiple ancillary regulators. For example, the system 1405 may include multiple ancillary regulators coupled between the supply rail 305 and the circuit block 315, in which each ancillary regulator may be a separate instance (copy) of the ancillary regulator 1310 shown in FIG. 13. In this example, the count value from the counter 510 in the control regulator 310 may be routed to each ancillary regulator to control each ancillary regulator. Also, in this example, the size control signal, the Enable_Few signal and the Enable_Rest signal may be routed to each of the ancillary regulators.

Figure 15:
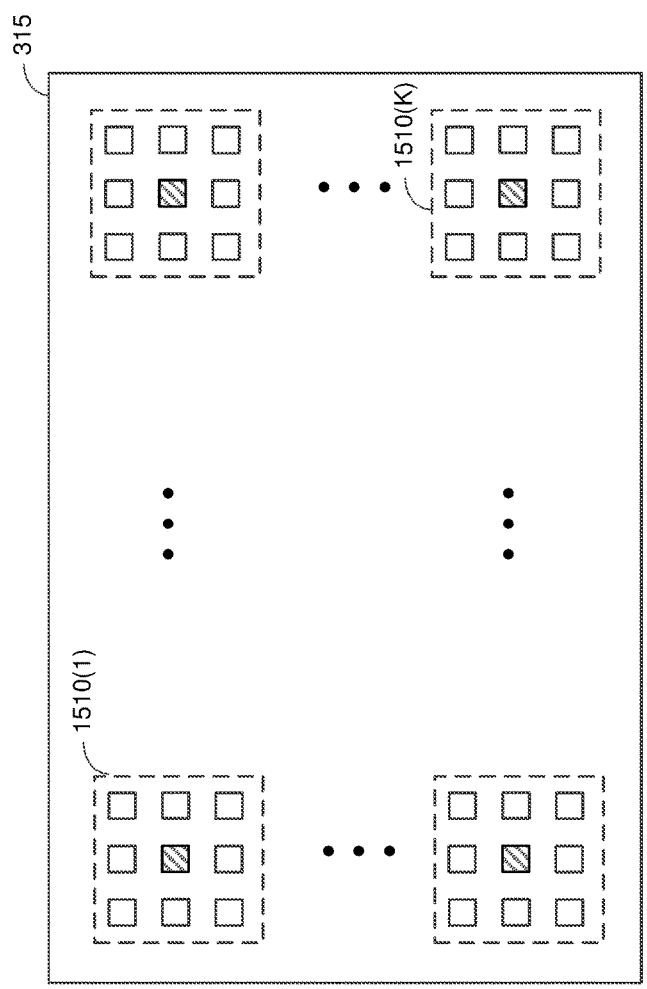
FIG. 15 shows an exemplary distribution of regulators according to certain aspects of the present disclosure.

In certain aspects, multiple regulators may be distributed across the circuit block 315 (e.g., processor) to power different areas of the circuit block 315. In this regard, FIG. 15 shows an example of multiple regulators distributed across the circuit block 315, in which the regulars are depicted with squares for ease of illustration. Note that FIG. 15 shows a top view of the circuit block 315. In this example, the regulators are grouped into multiple groups 1510(1) to 1510(K), where each group include a respective control regulator and a respective set of ancillary regulators. In FIG. 15, the control regulators are shaded and the ancillary regulators are unshaded. The control regulators and the ancillary regulators may be coupled between the supply rail 305 and the circuit block 315. Each of the control regulators may be a separate instance (copy) of the control regulator 310, and each of the ancillary regulators may be a separate instance (copy) of the ancillary regulator 1310.

In each group 1510(1) to 1510(K), the respective control regulator controls the respective ancillary regulators in the group. In this regard, the count value of each control regulator is routed to the ancillary regulators in the respective group. For ease of illustration, the individual connections between each control regulator and the respective ancillary regulators are not explicitly shown in FIG. 15.

In this example, the reference voltage Vref, the size control signal, the clock signal Clk, the Enable_Few signal and the Enable_Rest signal may be routed to each of the control regulators. Also, the size control signal, the Enable_Few signal and the Enable_Rest signal may be routed to each of the ancillary regulators. For ease of illustration, the lines routing the above signals to the regulators are not explicitly shown in FIG. 15.

The Enable_Few signal may be routed to the control regulators and ancillary regulators via a control line with delay elements between the regulators to stagger activation of the weak FETs of the regulators. Similarly, the Enable_Rest signal may be routed to the control and ancillary regulators via a control line with delay elements between the regulators to stagger activation of the strong FETs of the regulators.

Figure 16:
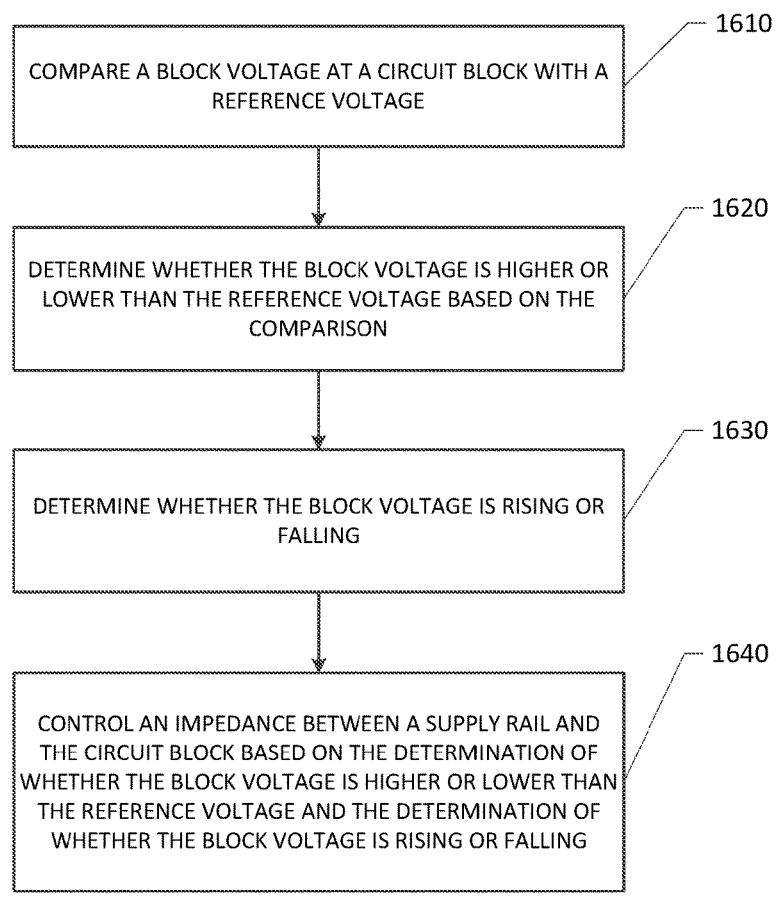
FIG. 16 is a flowchart illustrating a method for voltage regulation according to certain aspects of the present disclosure.

FIG. 16 is a flowchart illustrating a method 1600 for voltage regulation according to certain aspects of the present disclosure. The method 1600 may be performed by the regulator 310.

At step 1610, a block voltage at a circuit block is compared with a reference voltage.

For example, the block voltage may be compared with the reference voltage using the voltage level comparator 340.

At step 1620, a determination is made whether the block voltage is higher or lower than the reference voltage based on the comparison.

At step 1630, a determination is made whether the block voltage is rising or falling. For example, the determination of whether the block voltage is rising or falling may be made using the slope detector 335.

At step 1640, an impedance between a supply rail and the circuit block is controlled based on the determination of whether the block voltage is higher or lower than the reference voltage and the determination of whether the block voltage is rising or falling. For example, the impedance may be decreased if the block voltage is lower than the reference voltage and the block voltage is falling, and the impedance may be increased if the block voltage is higher than the reference voltage and the block voltage is rising. In another example, the impedance may be held if the block voltage is lower than the reference voltage and the block voltage is rising, and the impedance may be held if the block voltage is higher than the reference voltage and the block voltage is falling.

Figure 17:
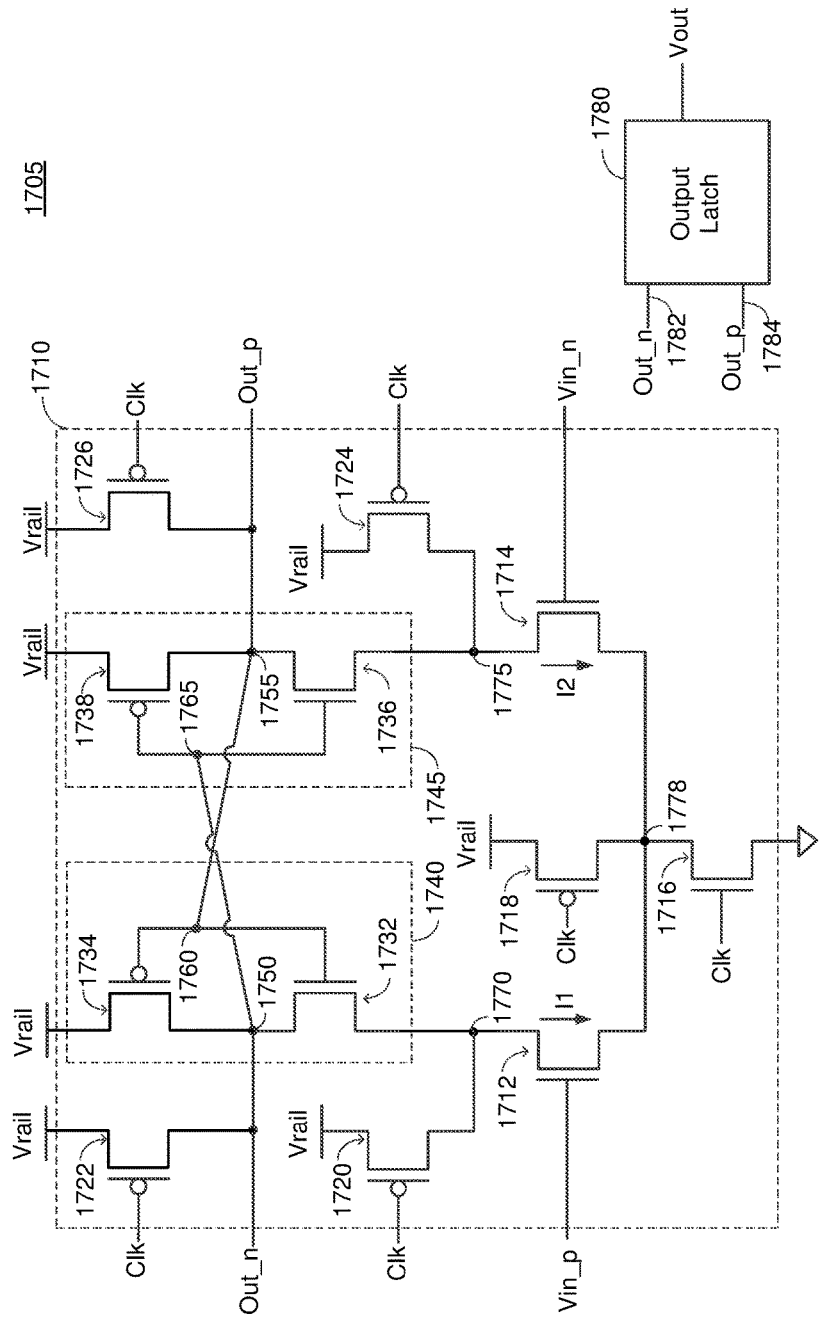
FIG. 17 shows an exemplary implementation of a voltage comparator according to certain aspects of the present disclosure.

FIG. 17 shows an example of a clocked voltage comparator 1705 according to certain aspects of the present disclosure. The clocked voltage comparator 1705 includes an input latch 1710 and an output latch 1780.

The input latch 1710 includes a first input FET 1712 and a second input FET 1714. The gate of the first input FET 1712 is coupled to a positive input (denoted "Vin_p") of the comparator 1705, and the gate of the second input FET 1714 is coupled to a negative input (denoted "Vin_n") of the comparator 1705. In the example shown in FIG. 17, each of the input FETs is implemented with an NFET. The sources of the first and second inputs FET 1712 and 1714 are coupled to internal node 1778.

The input latch 1710 also includes first and second inverters 1740 and 1745 that are cross coupled with each other, in which the output 1750 of the first inverter 1740 is coupled to the input 1765 of the second inverter 1745, and the output 1755 of the second inverter 1745 is coupled to the input 1760 of the first inverter 1740. The first inverter 1740 includes a first PFET 1734 and a first NFET 1732. The gates of the first PFET 1734 and the first NFET 1732 are coupled to the input 1760 of the first inverter 1740, and the drains of the first PFET 1734 and the first NFET 1732 are coupled to the output 1750 of the first inverter 1740. The source of the first PFET 1734 is coupled to the supply rail, and the source of the first NFET 1732 is coupled to the drain of the first input FET 1712. The second inverter 1745 includes a second PFET 1738 and a second NFET 1736. The gates of the second PFET 1738 and the second NFET 1736 are coupled to the input 1765 of the second inverter 1745, and the drains of the second PFET 1738 and the second NFET 1736 are coupled to the output 1755 of the second inverter 1745. The source of the second PFET 1738 is coupled to the supply rail, and the source of the second NFET 1736 is coupled to the drain of the second input FET 1714.

The input latch 1705 also includes a sampling NFET 1716 coupled between internal node 1778 and ground. The gate of the sampling NFET 1716 is driven by the clock signal Clk. As discussed further below, the sampling NFET 1716 is configured to couple node 1778 (and hence the sources of the input FETs 1712 and 1714) to ground when the clock signal Clk is high.

The input latch 1705 further includes reset PFETs 1718, 1720, 1722, 1724 and 1726. Reset PFET 1718 is coupled between internal node 1778 and the supply rail. Reset PFET 1720 is coupled between internal node 1770 and the supply rail, and reset PFET 1724 is coupled between internal node 1775 and the supply rail. Internal node 1770 is located between the source of the first NFET 1732 and the drain of the first input FET 1712, and internal node 1775 is located between the source of the second NFET 1736 and the drain of the second input FET 1714, as shown in FIG. 17. Reset PFET 1726 is coupled between a first output of the input latch 1710 (denoted "Out_p") and the supply rail, and reset PFET 1722 is coupled between a second output of the input latch 1710 (denoted "Out_n") and the supply rail. The gates of the reset PFETs 1718, 1720, 1722, 1724 and 1726 are driven by the clock signal Clk. As discussed further below, the reset PFETs 1718, 1720, 1722, 1724 and 1726 are configured to couple the internal nodes 1770, 1775 and 1778 and the outputs Out_p and Out_n to the supply rail when the clock signal Clk is low.

During each clock period (cycle), the input latch 1710 pre-charges during a reset phase of the clock period, and samples the voltages at the inputs of the input latch 1710 during an evaluation phase of the clock period. In the example shown in FIG. 17, the clock signal Clk is low during the reset phase and high during the evaluation phase. Exemplary operations of the input latch 1710 during one clock period (cycle) will now be discussed below according to certain aspects of the present disclosure.

During the reset phase, the clock signal Clk is low, which turns on all of the reset PFETs 1718, 1720, 1722, 1724 and 1726. As a result, the reset PFETs 1720, 1724 and 1718 couple the internal nodes 1770, 1775 and 1778, respectively, to the supply rail, which causes the internal nodes 1770, 1775 and 1778 to pre-charge to the supply voltage Vrail. Note that the sampling NFET 1716 is turned off during the reset phase, allowing reset PFET 1718 to pre-charge internal node 1778 to the supply voltage Vrail. The reset PFETs 1726 and 1722 couple the first and second outputs Out_p and Out_n, respectively, to the supply voltage, which causes the first and second outputs Out_p and Out_n to pre-charge to the supply voltage Vrail. Thus, at the end of the reset phase, the internal nodes 1770, 1775 and 1778 and the outputs Out_p and Out_n are pre-charged to the supply voltage Vrail. The voltages at the inputs Vin_p and Vin_n are not sampled during the reset phase.

When the clock signal Clk transitions from low to high, the input latch 1710 enters the evaluation phase, during which time the voltages at the inputs Vin_p and Vin_n are sampled. The high clock signal Clk turns off the reset PFETs 1718, 1720, 1722, 1724 and 1726, which decouples the internal nodes 1770, 1775 and 1778 and the outputs Out_p and Out_n from the supply rail. The high clock signal Clk also turns on the sampling NFET 1716, which couples the sources of the first and second input FETs 1712 and 1714 to ground through the sampling NFET 1716. This allows the first and second inputs FETs 1712 and 1714 to conduct current to ground.

During the evaluation phase, the first input FET 1712 converts the voltage at the positive input Vin_p into current I1, and the second input FET 1714 converts the voltage at the negative input Vin_n into current I2. The current I1 flowing through the first input FET 1712 lowers the voltage at internal node 1770, and the current I2 flowing through the second input FET 1714 lowers the voltage at internal node 1775.

If the voltage at the positive input Vin_P is higher than the voltage at the negative input Vin_n, then the current I1 flowing through the first input FET 1712 is higher (stronger) than the current I2 flowing through the second input FET 1714, assuming the first and second input FETs are matched. In this case, the higher current flowing through the first input FET 1712 causes internal node 1770 to fall faster than internal node 1775. The reduction in the voltage at internal node 1770 causes the first NFET 1732 in the first inverter 1740 to turn on. This is because the gate-to-source voltage of the first NFET 1732 increases as the voltage at internal node 1770 (which is coupled to the source of the first NFET 1732) is reduced. When the first NFET 1732 turns on, the first NFET 1732 starts pulling down the second output Out_n, causing the voltage at the second output Out_n to fall.

The reduction in the voltage at the second output Out_n then causes the second PFET 1738 of the second inverter 1745 to turn on. This is because the second output Out_n is coupled to the gate of the second PFET 1738. When the second PFET 1738 turns on, the second PFET 1738 couples the first output Out_p to the supply rail (and hence pulls up the first output Out_p). This triggers a positive-feedback mechanism of the cross-coupled inverters 1740 and 1745, which pulls the second output Out_n low (e.g., approximately to ground) and pulls the first output Out_p high (e.g., approximately to Vrail). Thus, when the voltage at the positive input Vin_p is higher than the voltage at the negative input Vin_n, the first and second outputs Out_p and Out_n of the latch 1710 settle to logic one and logic zero, respectively, during the evaluation phase.

If the voltage at the negative input Vin_n is higher than the voltage at the positive input Vin_p, then the current I2 flowing through the second input FET 1714 is higher (stronger) than the current I1 flowing through the first input FET 1712, assuming the first and second input FETs are matched. In this case, the higher current flowing through the second input FET 1714 causes internal node 1775 to fall faster than internal node 1770. The reduction in the voltage at internal node 1775 causes the second NFET 1736 in the second inverter 1745 to turn on. This is because the gate-to-source voltage of the second NFET 1736 increases as the voltage at internal node 1775 (which is coupled to the source of the second NFET 1736) is reduced. When the second NFET 1736 turns on, the second NFET 1736 starts pulling down the first output Out_p, causing the voltage at the first output Out_p to fall.

The reduction in the voltage at the first output Out_p then causes the first PFET 1734 of the first inverter 1740 to turn on. This is because the first output Out_p is coupled to the gate of the first PFET 1734. When the first PFET 1734 turns on, the first PFET 1734 couples the second output Out_n to the supply rail (and hence pulls up the second output Out_n).

This triggers the positive-feedback mechanism of the cross-coupled inverters 1740 and 1745, which pulls the first output Out_p low (e.g., approximately ground) and pulls the second output Out_n high (e.g., approximately Vrail). Thus, when the voltage at the negative input Vin_n is higher than the voltage at the positive input Vin_p, the first and second outputs Out_p and Out_n of the latch 1710 settle to logic zero and logic one, respectively, during the evaluation phase.

Thus, during the reset phase, the internal nodes 1770, 1775 and 1778 and the outputs Out_p and Out_n are pre-charged to Vrail. During the evaluation phase, the voltages at the inputs of the latch 1710 are sampled, in which the first and second outputs Out_p and Out_n settle to one and zero, respectively, if the voltage at the positive input Vin_p is higher than the voltage at the negative input Vin_n, and the first and second outputs Out_p and Out_n settle to zero and one, respectively, if the voltage at the positive input Vin_p is lower than the voltage at the negative input Vin_n.

The output latch 1780 has a first input 1782 coupled to the second output Out_n of the input latch 1710, a second input 1874 coupled to the first output Out_p of the input latch 1710, and an output (denoted "Vout"). At the end of the evaluation phase, the output latch 1780 latches the logic value at the first output Out_p, and outputs the latched logic value at the output Vout, which provides the output of the voltage comparator 1705. The latched value is one if the voltage at the positive input Vin_p is higher than the voltage at the negative input Vin_n, and zero if the voltage at the positive input Vin_p is lower than the voltage at the negative input Vin_n. The output latch 1780 continues to output the latched value at the output Vout during the reset phase of the next clock period. The output Vout is updated again during the evaluation phase of the next clock period. The output latch 1780 may be implemented with a set-reset (SR) latch, as discussed further below.

The clocked voltage comparator 1705 may be used to implement the voltage level comparator 340. In this example, the positive input Vin_p is coupled to the block voltage Vblk, the negative input Vin_n is coupled to the reference voltage Vref, and the output Vout of the clocked voltage comparator 1705 provides the output signal Vblk_Hi of the voltage level comparator 340.

The clocked voltage comparator 1705 may also be used to implement the clocked voltage comparator 1010 in the exemplary slope detector 335 shown in FIG. 10. In this example, the positive input Vin_p is coupled to the output Vfout of the high-pass filter 1030, the negative input Vin_n is coupled to the reference voltage Vref, and the output Vout of the clock voltage comparator 1705 provides the output signal Vblk_Rise of the slope detector 335.

Figure 18:
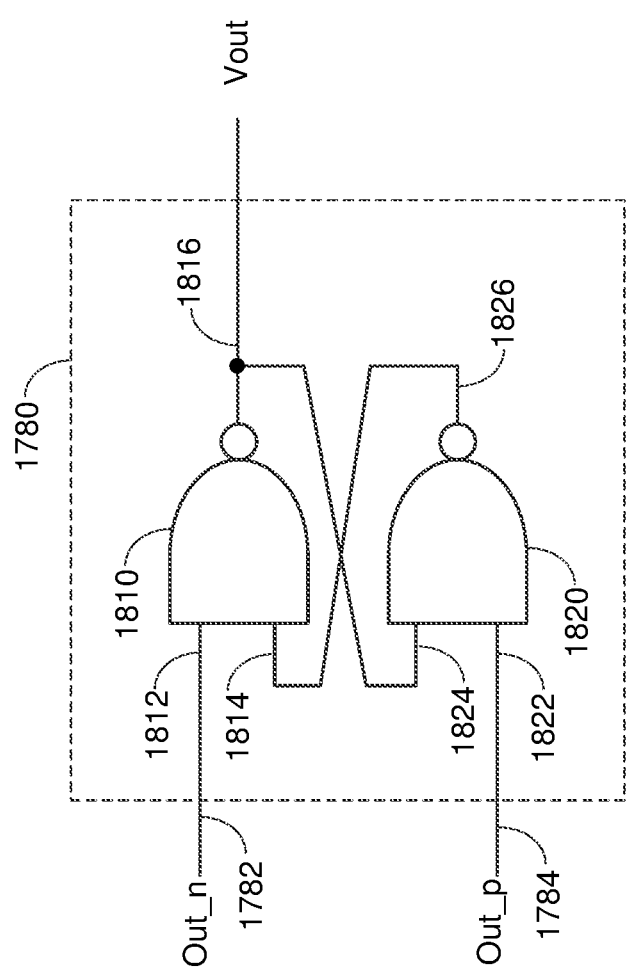
FIG. 18 shows an exemplary implementation of an output latch according to certain aspects of the present disclosure.

FIG. 18 shows an example in which the output latch 1780 is implemented with an SR latch according to certain aspects of the present disclosure. In this example, the output latch 1780 includes a first NAND gate 1810 and a second NAND gate 1820. The first NAND gate 1810 has a first input 1812 coupled to the second output Out_n of the input latch 1710, and a second input 1814 coupled to the output 1826 of the second NAND gate 1820. The output 1816 of the first NAND gate 1810 is coupled to the output Vout of the output latch 1780. The second NAND gate 1820 has a first input 1822 coupled to the first output Out_p of the input latch 1710, and a second input 1824 coupled to the output 1816 of the first NAND gate 1810.

In operation, the output Vout of the output latch 1780 is one if the first and second outputs Out_p and Out_n of the input latch 1710 are one and zero, respectively. This occurs when the voltage at the positive input Vin_p is higher than the voltage at the negative input Vin_n of the input latch 1710. The output Vout of the output latch 1780 is zero if the first and second outputs Out_p and Out_n of the input latch 1710 are zero and one, respectively. This occurs when the voltage at the positive input Vin_p is lower than the voltage at the negative input Vin_n of the input latch 1710.

If the first and second outputs Out_p and Out_n of the input latch 1710 are both one, then the output latch 1780 holds the current logic value at the output Vout. This occurs during the reset phase of a clock period since the first and second outputs Out_p and Out_n are both pre-charged to one during the reset phase. As a result, during the reset phase, the output latch 1780 outputs the logic value that was latched during the evaluation phase of the previous clock period (cycle).

Ideally, the input latch 1710 is in a metastable state when the voltages at the positive and negative inputs Vin_p and Vin_n are equal. This ensures that the first and second outputs Out_p and Out_n are one and zero, respectively, when the voltage at the positive input Vin_p is slightly above the voltage at the negative input Vin_n, and the first and second outputs Out_p and Out_n are zero and one, respectively, when the voltage at the positive input Vin_n is slightly below than the voltage at the negative input Vin_n.

However, in practice, the input latch 1710 has an input offset voltage that causes the input latch 1710 to enter the metastable state when the voltage at the positive input Vin_p is offset from the voltage at the negative input Vin_n. The input offset voltage may be caused by mismatches between the first and second input FETs 1712 and 1714 and/or mismatches between other components of the input latch 1710. The mismatches may be due to process variation and/or other factors, and may be sensitive to temperature.

The input offset voltage negatively impacts the accuracy of the voltage comparator 1705, which, in turn, negatively impacts the accuracy of the voltage regulator 310 incorporating the voltage comparator 1705. For example, an input offset of tens of millivolts may cause the voltage regulator 310 to regulate the block voltage Vblk to a voltage that is offset from the reference voltage Vref by tens of millivolts, making the regulator unsuitable in many cases. For a system that employs multiple control regulators, the input offset voltages of the level comparators in the control regulators may vary. This may cause one of the control regulators to regulate to a higher voltage than the other control regulators, in which case the one control regulator supplies more current to the block circuit than the other control regulators.

To address the above problems, an offset-compensation system may be employed to reduce the input offset voltage of the voltage comparator 1705. The reduction in the input offset voltage improves the accuracy of the voltage comparator 1705, which, in turn, improves the accuracy of the voltage regulator 310 incorporating the voltage comparator 1705. This allows the voltage regulator 310 to regulate the block voltage Vblk to a voltage that is close to the reference voltage Vref (e.g., within a few millivolts of the reference voltage Vref).

Figure 19:
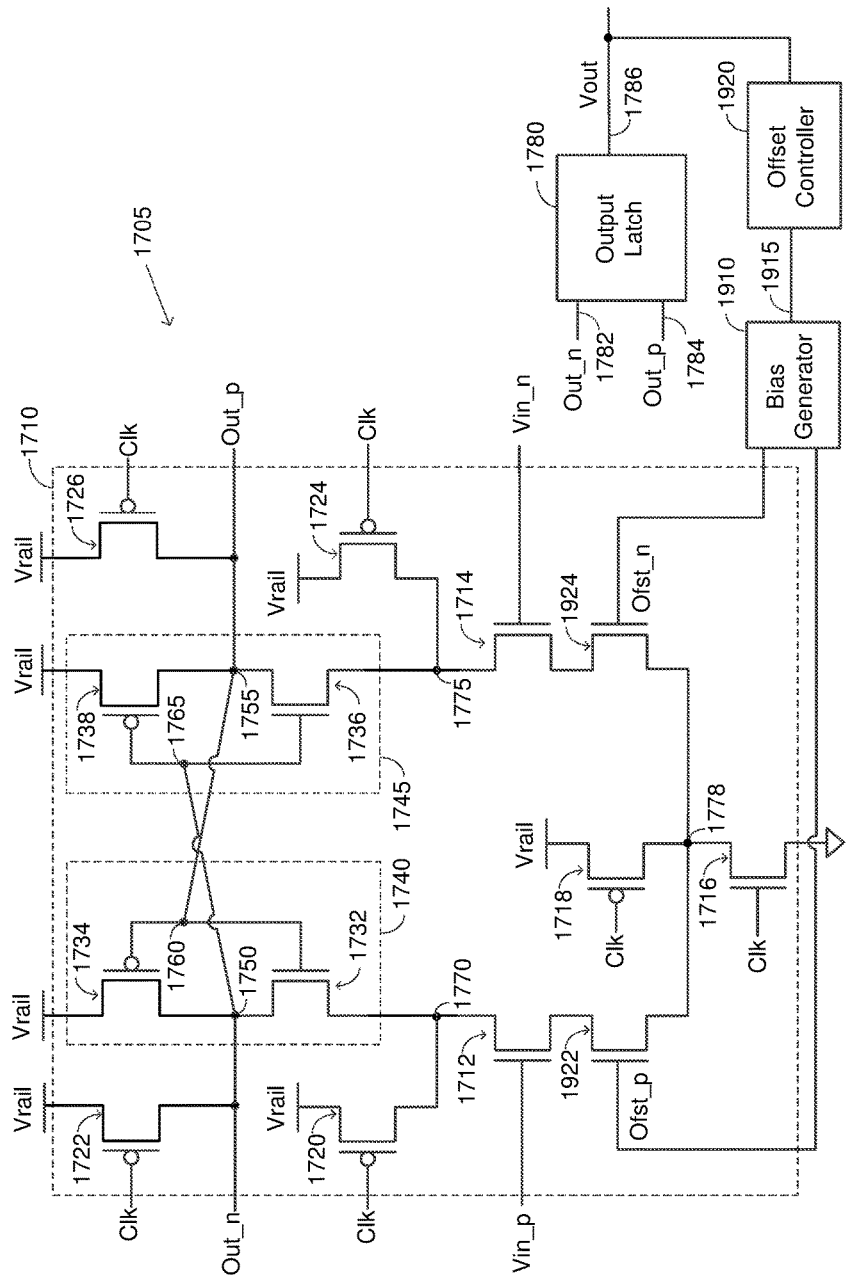
FIG. 19 shows an example of an offset-compensation system according to certain aspects of the present disclosure.

In this regard, FIG. 19 shows an example of an offset-compensation system for the clocked voltage comparator 1705 according to certain aspects of the present disclosure. In this example, the offset-compensation system includes a first compensation FET 1922, a second compensation FET 1924, an offset controller 1920, and a bias generator 1910.

The first compensation FET 1922 is coupled between the source of the first input FET 1712 and internal node 1778, in which the first compensation FET 1922 is coupled in series with the first input FET 1712. The second compensation FET 1924 is coupled between the source of the second input FET 1714 and internal node 1778, in which the second compensation FET 1924 is coupled in series with the second input FET 1714. In the example shown in FIG. 19, each of the compensation FETs 1922 and 1924 is implemented with an NFET.

The bias generator 1910 is configured to generate a first bias voltage (denoted "Ofst_p") and a second bias voltage (denoted "Ofst_n") under the control of the offset controller 1920. The first bias voltage Ofst_p is applied to the gate of the first compensation FET 1922, and the second bias voltage Ofst_n is applied to the gate of the second compensation FET 1924. As discussed further below, the offset controller 1920 adjusts the first and second bias voltages Ofst_p and Ofst_n during an offset-calibration procedure to reduce the input offset voltage of the voltage comparator 1705.

The offset-calibration procedure will now be discussed according to certain aspects of the present disclosure. At the start of the offset-calibration procedure, the same voltage is applied to the positive and negative inputs Vin_p and Vin_n of the input latch 1710. For example, the reference voltage Vref may be applied to the positive and negative inputs Vin_p and Vin_n of the input latch 1710 during offset calibration. Ideally, the input latch 1710 is in a metastable state since the same voltage is applied to the positive and negative inputs Vin_p and Vin_n of the input latch 1710. However, due to the input offset voltage of the input latch 1710, the output of the voltage comparator 1705 is either one or zero depending on the polarity of the input offset voltage.

The offset controller 1920 senses the logic value at the output of the voltage comparator 1705, and determines the direction in which the first and second bias voltages Ofst_p and Ofst_n need to be adjusted to reduce the input offset voltage based on the sensed logic value. For example, if the logic value at the output is one, then the offset controller 1920 may increase the second bias voltage Ofst_n and decrease the first bias voltage Ofst_p to reduce the offset voltage. If the logic value at the output is zero, then the offset controller 1920 may increase the first bias voltage Ofst_p and decrease the second bias voltage Ofst_n to reduce the offset voltage.

During offset calibration, the offset controller 1920 adjusts the bias voltages Ofst_p and Ofst_n in steps (referred to below as calibration steps) based on the logic value at the output of the voltage comparator 1705. In each calibration step, the offset controller 1920 decreases the first bias voltage Ofst_p by a small amount and increases the second bias voltage Ofst_n by a small amount if the output logic value is one, and increases the first bias voltage Ofst_p by a small amount and decreases the second bias voltage Ofst_n amount if the output logic value is zero. In this example, the output logic value may eventually start toggling between one and zero after multiple calibration steps. The toggling of the output logic value indicates that the input offset voltage is relatively small since the offset controller 1920 adjusts the bias voltages Ofts_p and Ofst_n by small amounts in each calibration step. The offset controller 1920 may hold the bias voltages Oft_p and Ofst_n (i.e., stop adjusting the bias voltages Oft_p and Ofst_n) after the first toggle of the output logic value or after multiple toggles of the output logic value. After offset calibration is complete, the offset controller 1920 may switch the voltage comparator 1705 to normal operation.

During normal operation, the positive input Vin_p is coupled to the block voltage Vblk for the example in which the voltage comparator is used to implement the voltage level comparator 340. The positive input Vin_p is coupled to the output Vfout of the high-pass filter 1030 for the example in which the voltage comparator is used in the slope detector 335.

Figure 20:
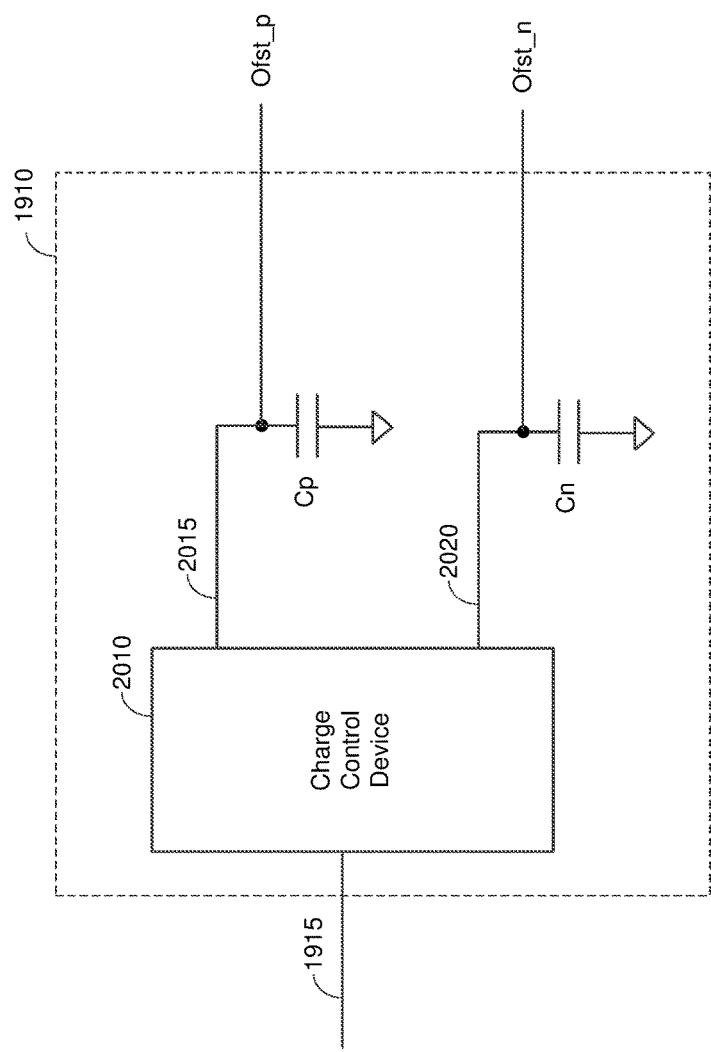
FIG. 20 shows an exemplary implementation of a bias generator according to certain aspects of the present disclosure.

FIG. 20 shows an exemplary implementation of the bias generator 1910 according to certain aspects of the present disclosure. In this example, the bias generator 1910 includes a charge control device 2110, a first bias capacitor Cp, and a second bias capacitor Cn. The first bias capacitor Cp is coupled between the gate of the first compensation FET 1922 (shown in FIG. 19) and ground. In this example, the voltage of the first bias capacitor Cp provides the bias voltage Ofst_p for the first compensation FET 1922.

The second bias capacitor Cn is coupled between the gate of the second compensation FET 1924 (shown in FIG. 19) and ground. In this example, the voltage of the second bias capacitor Cn provides the bias voltage Ofst_n for the second compensation FET 1924.

In operation, the charge control device 2010 receives a control signal from the offset controller 1920 via control line 1915, and adjusts the bias voltages Ofst_p and Ofst_n based on the control signal. The charge control device 2010 adjusts the first bias voltage Ofst_p by adding charge to or removing charge from the first bias capacitor Cp, and adjusts the second bias voltage Ofst_n by adding charge to or removing charge from the second bias capacitor Cn. The control line 1915 may include a single signal line or multiple signal lines in parallel.

In certain aspects, the offset controller 1920 may provide instructions to the bias generator 1910 for each calibration step instructing the bias generator 1910 how to adjust the bias voltages Ofst_p and Ofst_n.

For each calibration step in which the output logic value is one, the offset controller 1920 may instruct the bias generator 1910 to increase the second bias voltage Ofst_n and decrease the first bias voltage Ofst_p. To do this, the charge control device 2010 adds a small amount of charge to the second bias capacitor Cn (which increases the second bias voltage Ofst_n by a small amount), and removes a small amount of charge from the first bias capacitor Cp (which decreases the first bias voltage Ofst_p by a small amount).

For each calibration step in which the output logic is zero, the offset controller 1920 may instruct the bias generator 1910 to increase the first bias voltage Ofst_p and decrease the second bias voltage Ofst_n. To do this, the charge control device 2010 adds a small amount of charge to the first bias capacitor Cp (which increases the first bias voltage Ofst_p by a small amount), and removes a small amount of charge from the second bias capacitor Cn (which decreases the second bias voltage Ofst_n by a small amount).

Thus, in this example, the charge control device 2010 controls the first bias voltage Ofst_p by controlling the amount of charge on the first bias capacitor Cp, and controls the second bias voltage Ofst_n by controlling the amount of charge on the second bias capacitor Cn.

In certain aspects, the first and second bias voltages Ofst_p and Ofst_n are calibrated to voltage levels above the reference voltage Vref. This provides one or more of the following advantages. For example, by biasing the compensation FETs 1922 and 1924 to voltages larger than the reference voltage Vref, changes in the bias voltages Ofst_p and Ofst_n of the compensation FETs may result in much smaller changes in the input offset voltage of the comparator. This property allows finer adjustments to be made to the offset voltage. In addition, by biasing the compensation FETs 1922 and 1924 to voltages larger than the reference voltage Vref, a relatively large amount of bias voltage noise results in a small amount of variation in the offset voltage of the comparator, providing good immunity to bias voltage noise. Further, biasing the compensation FETs 1922 and 1924 to voltages larger than the reference voltage Vref ensures the comparator remains operational over the full calibration voltage range. If the bias voltages on the compensation FETs 1922 and 1924 go too low, then these FETs are turned off, and the comparator ceases to operate (i.e., the output value of the comparator is not affected by the input voltages).

Figure 21:
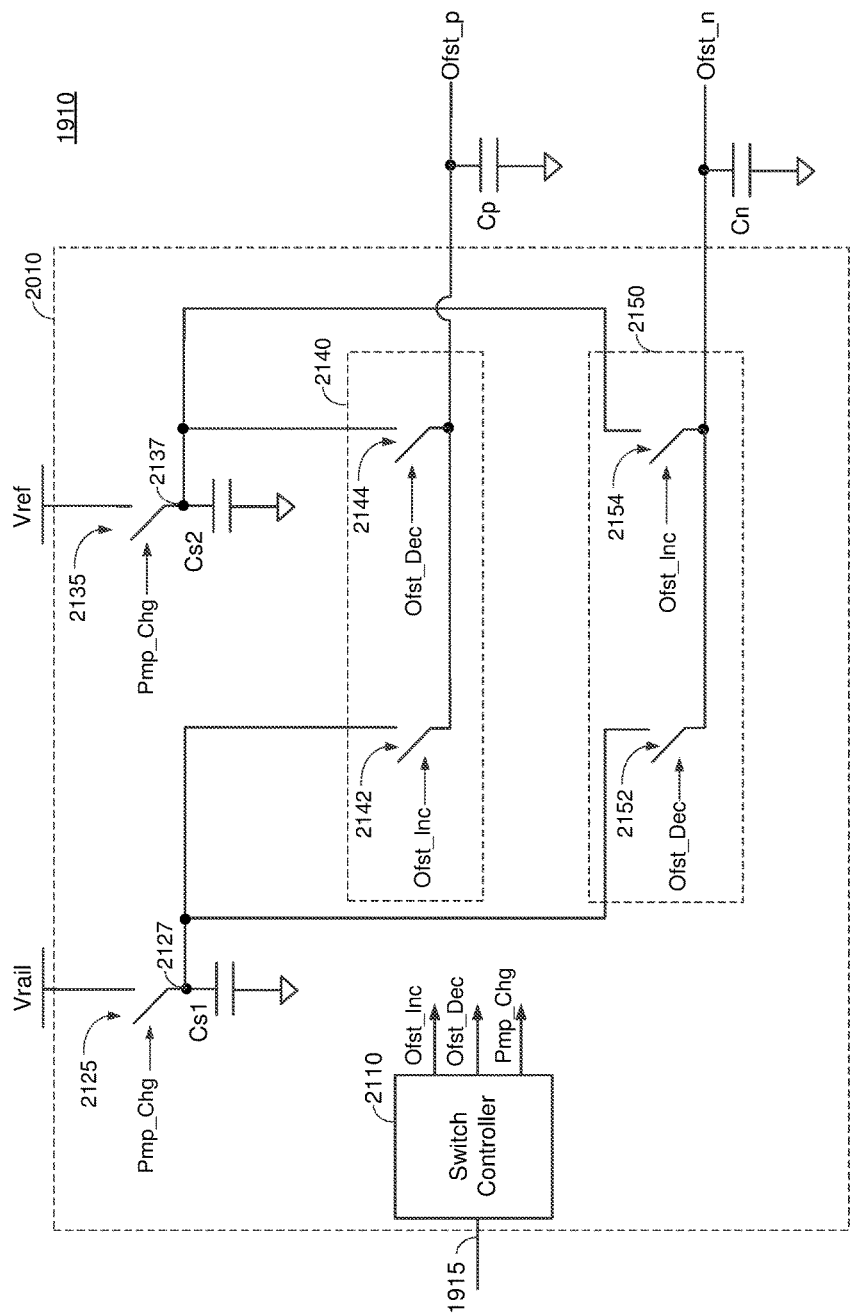
FIG. 21 shows an exemplary implementation of a charge control device according to certain aspects of the present disclosure.

FIG. 21 shows an exemplary implementation of the charge control device 2010 according to certain aspects of the present disclosure. In this example, the charge control device 2010 includes a switch controller 2110, a first switch 2125, a second switch 2135, a first storage capacitor Cs1, a second storage capacitor Cs2, a first switching device 2140, and a second switching device 2150.

The first switch 2125 is coupled between the supply rail and node 2127, and the first storage capacitor Cs1 is coupled between node 2127 and ground. The first switch 2125 is controlled by switch control signal Pmp_Chg, as discussed further below. The second switch 2135 is coupled between the reference voltage Vref and node 2137, and the second storage capacitor Cs2 is coupled between node 2137 and ground. The second switch 2135 is controlled by switch control signal Pmp_Chg, as discussed further below.

The first switching device 2140 is configured to selectively couple the first bias capacitor Cp to node 2127 or node 2137. In the example in FIG. 21, the first switching device 2140 includes a third switch 2142 coupled between node 2127 and the first bias capacitor Cp, and a fourth switch 2144 coupled between node 2137 and the first bias capacitor Cp. The third switch 2142 is controlled by switch control signal Ofst_Inc, and the fourth switch 2144 is controlled by switch control signal Ofst_Dec.

The second switching device 2150 is configured to selectively couple the second bias capacitor Cn to node 2127 or node 2137. In the example in FIG. 21, the second switching device 2150 includes a fifth switch 2152 coupled between node 2127 and the second bias capacitor Cn, and a sixth switch 2154 coupled between node 2137 and the second bias capacitor Cn. The fifth switch 2152 is controlled by switch control signal Ofst_Dec, and the sixth switch 2154 is controlled by switch control signal Ofst_Inc.

The switch controller 2110 generates the switch control signals Pmp_Chg, Ofst_Inc and Ofst_Dec based on the control signal from the offset controller 1920. As discussed further below, the switch controller 2110 controls the switches 2125, 2135, 2142, 2144, 2152 and 2154 using the switch control signals to adjust the amount of charge on the first bias capacitor Cp and the amount of charge on the second bias capacitor Cn.

Exemplary operations of the charge control device 2010 will now be discussed according to certain aspects of the present disclosure. In the discussion below, it is assumed that, at the start of an offset-calibration procedure, each of the bias voltages Ofst_p and Ofst_n is initially between the supply voltage Vrail and the reference voltage Vref.

To increase the second bias voltage Ofst_n and decrease the first bias voltage Ofst_p in a calibration step, the switch controller 2150 may perform the following operations. During a first portion of the calibration step, the switch controller 2150 turns on (i.e., closes) the first and switches 2125 and 2135 and turns off (i.e., opens) the third, fourth, fifth and sixth switches 2142, 2144, 2152 and 2154. As a result, the first storage capacitor Cs1 is coupled to the supply rail through the first switch 2125, and the second storage capacitor Cs2 is coupled to the reference voltage Vref through the second switch 2135. This sets the voltage of the first storage Cs1 to approximately Vrail and sets the voltage of the second storage Cs2 to approximately Vref.

During a second portion of the calibration step, the switch controller 2110 turns on (i.e., closes) the fourth switch 2144 and the fifth switch 2152, and turns off (i.e., opens) the first, second, third and sixth switches 2125, 2135, 2142 and 2154. As a result, the first bias capacitor Cp is coupled to the second storage capacitor Cs2 through the fourth switch 2144. Assuming the voltage on the first bias capacitor Cp is above Vref, this causes charge to flow from the first bias capacitor Cp to the second storage capacitor Cs2 until the voltages on the first bias capacitor Cp and the second storage capacitor Cs2 are approximately equal. The charge flow from the first bias capacitor Cp to the second storage capacitor Cs2 removes charge from the first bias capacitor Cp, which decreases the first bias voltage Ofst_p.

Also, the second bias capacitor Cn is coupled to the first storage capacitor Cs1 through the fifth switch 2152. This causes charge to flow from the first storage capacitor Cs1 to the second bias capacitor Cn until the voltages on the second bias capacitor Cn and the first storage capacitor Cs1 are approximately equal. The charge flow from the first storage capacitor Cs1 to the second bias capacitor Cn adds charge to the second bias capacitor Cn, which increases the second bias voltage Ofst_n.

Thus, during the first portion of the calibration step, the voltages of the first and second storage capacitors Cs1 and Cs2 are set to Vrail and Vref, respectively. During the second portion of the calibration step, charge is transferred from the first bias capacitor Cp to the second storage capacitor Cs2 to decrease the first bias voltage Ofst_p, and charge is transferred from the first storage capacitor Cs1 to the second bias capacitor Cn to increase the second bias voltage Ofst_n. If the storage capacitors Cs1 and Cs2 have much smaller capacitances than the bias capacitors Cp and Cn, then the changes in the bias voltages Ofst_p and Ofst_n in one calibration step are small. This helps provide fine adjustment of the offset voltage in one calibration step.

To increase the first bias voltage Ofst_p and decrease the second bias voltage Ofst_n in a calibration step, the switch controller 2150 may perform the following operations. During the first portion of the calibration step, the switch controller 2150 turns on (i.e., closes) the first and switches 2125 and 2135 and turns off (i.e., opens) the third, fourth, fifth and sixth switches 2142, 2144, 2152 and 2154. As discussed above, this sets the voltage of the first storage Cs1 to approximately Vrail and sets the voltage of the second storage Cs2 to Vref.

During the second portion of the calibration step, the switch controller 2150 turns on (i.e., closes) the third switch 2142 and the sixth switch 2154, and turns off (i.e., opens) the first, second, fourth and fifth switches 2125, 2135, 2144 and 2152. As a result, the first bias capacitor Cp is coupled to the first storage capacitor Cs1 through the third switch 2142. This causes charge to flow from the first storage capacitor Cs1 to the first bias capacitor Cp until the voltages on the first bias capacitor Cp and the first storage capacitor Cs1 are approximately equal. The charge flow from the first storage capacitor Cs1 to the first bias capacitor Cp adds charge to the first bias capacitor Cp, which increases the first bias voltage Ofst_p.

Also, the second bias capacitor Cn is coupled to the second storage capacitor Cs2 through the sixth switch 2154. Assuming the voltage on the second bias capacitor Cn is above Vref, this causes charge to flow from the second bias capacitor Cn to the second storage capacitor Cs2 until the voltages on the second bias capacitor Cn and the second storage capacitor Cs2 are approximately equal. The charge flow from the second bias capacitor Cn to the second storage capacitor Cs2 removes charge from the second bias capacitor Cn, which decreases the second bias voltage Ofst_n.

Thus, during the first portion of the calibration step, the voltages of the first and second storage capacitors Cs1 and Cs2 are set to Vrail and Vref, respectively. During the second portion of the calibration step, charge is transferred from the first storage capacitor Cs1 to the first bias capacitor Cp to increase the first bias voltage Ofst_p, and charge is transferred from the second bias capacitor Cn to the second storage capacitor Cs2 to decrease the second bias voltage Ofst_n. If the storage capacitors Cs1 and Cs2 have much smaller capacitances than the bias capacitors Cp and Cn, then the changes in the bias voltages Ofst_p and Ofst_n in one calibration step are small. This helps provide fine adjustment of the offset voltage in one calibration step.

In the above discussion it was assumed that, at the start of an offset-calibration procedure, each of the bias voltages Ofst_p and Ofst_n is initially between the supply voltage Vrail and the reference voltage Vref. However, it is to be appreciated that in actual operation, the initial bias voltages can be anywhere between ground and Vrail. If the bias voltages start at ground, then the comparator may not be operational until the bias voltages reach the calibration range. However, even if the comparator is not operational (i.e., the output value does not depend on the input voltages), the calibration procedure eventually brings the bias voltages into the calibration voltage range (i.e., between Vrail and Vref). Once the bias voltages are within the calibration voltage range, the comparator is operational, (i.e., the output value does depend on the input value). When the bias voltages start at ground, it may take several hundred nanoseconds for the calibration procedure to bring the bias voltages into the calibration voltage range.

As discussed above, the adjustments in the first bias voltage Ofst_p and the second bias voltage Ofst_n in one calibration step may be made small by making the capacitance of each of the storage capacitors Cs1 and Cs2 much smaller than the capacitance of each of the bias capacitors Cp and Cn. This is because the change in the first bias voltage Ofst_p in one calibration step is proportional to Cs/(Cs+Cp), where Cs is either Cs1 or Cs2 depending on whether the first bias capacitor Cp is coupled to Cs1 or Cs2 during the calibration step. The same holds for the second bias voltage Ofst_n. In certain aspects, the capacitances of the bias capacitors Cp and Cn and the capacitances of the storage capacitors Cs1 and Cs2 may be chosen such that the change in each of the first and second bias voltages Ofst_p and Ofst_n in one calibration step is equal to or less than ten percent of the supply voltage Vrail. In one example, each of the storage capacitors Cs1 and Cs2 may have a capacitance of approximately 2 fF, and each of the bias capacitors Cp and Cn may have a capacitance of approximately 128 fF. In this example, the change in each of the first and second bias voltages Ofst_p and Ofst_n in one calibration step may be much less than ten percent of the supply voltage Vrail. The small changes in the bias voltages per calibration step helps provide fine adjustment of the offset voltage.

During normal operation, the offset controller 2110 turns off switches 2142, 2144, 2152 and 2154 to decouple the bias capacitors Cp and Cn from the storage capacitors Cs1 and Cs2. This allows the bias capacitors Cp and Cn to hold their charge (and hence hold the bias voltages Ofst_p and Ofst_n) during normal operation. The bias voltages Ofst_p and Ofst_n may slowly degrade over time due to current leakage. In this case, the voltage comparator may periodically undergo offset calibration to restore the bias voltages Ofst_p and Ofst_n. Note that FIG. 21 shows an example in which all of the switches are open.

Figure 22:
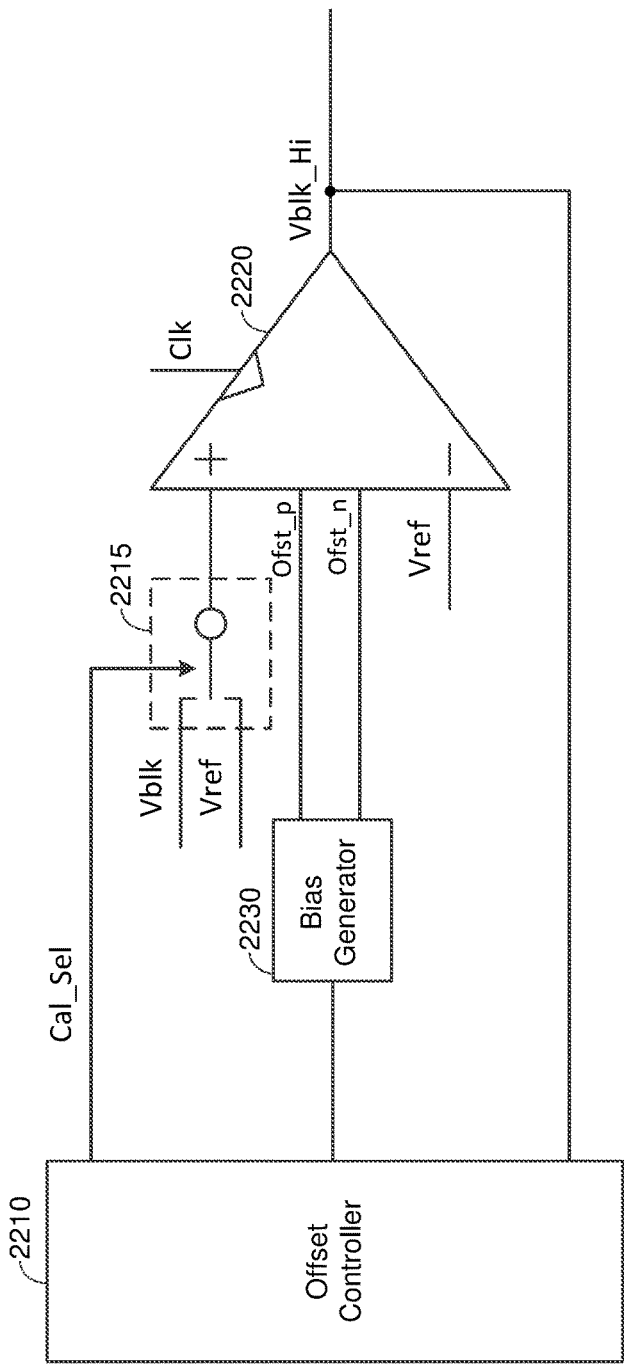
FIG. 22 shows an example of a voltage level comparator with offset compensation according to certain aspects of the present disclosure.

FIG. 22 shows an exemplary implementation of a voltage level comparator 2205 with offset compensation according to certain aspects of the present disclosure. The voltage level comparator 2205 may be used to implement the voltage level comparator 340 in the voltage regulator 310.

The voltage level comparator 2205 includes a clocked voltage comparator 2220, an offset controller 2210, a bias generator 2230, and a calibration switch 2215. The clocked voltage comparator 2120 may be implemented with the clocked voltage comparator 1710 shown in FIG. 19. In this example, the clocked voltage comparator 2220 includes the compensation FETs 1922 and 1924. The bias generator 2230 is configured to generate the bias voltages Ofst_p and Ofst_n for the compensation FETs 1922 and 1924 in the clocked voltage comparator 2220, and may be implemented with the bias generator 1910 shown in FIG. 20. The offset controller 2210 is configured to adjust the bias voltages Ofst_p and Ofst_n using the bias generator 2230 during offset calibration to reduce the offset voltage of the voltage comparator 2220.

The calibration switch 2215 is coupled to the positive input of the voltage comparator 2220, and is configured to selectively couple the block voltage Vblk or the reference voltage Vref to the positive input of the voltage comparator 2220. As discussed further below, during offset calibration, the offset controller 2210 instructs the switch 2215 to couple the reference voltage Vref to the positive input of the voltage comparator 2220 using control signal Cal_Sel. During normal operation, the offset controller 2210 instructs the switch 2215 to couple the block voltage Vblk to the positive input of the voltage comparator 2220 using control signal Cal_Sel.

The negative input of the voltage comparator 2220 is coupled to the reference voltage Vref, and the output of the voltage comparator 2220 provides the output signal Vblk_Hi for the level comparator 2205. In this example, the negative input of the voltage comparator 2220 is coupled to the reference voltage Vref during both offset calibration and normal operation.

The offset controller 2210 is configured to operate in an offset-calibration mode or a functional mode. In the offset-calibration mode, the offset controller 2210 instructs the calibration switch 2215 to couple the reference voltage Vref to the positive input of the voltage comparator 2220. As a result, the positive and negative inputs of the voltage comparator 2220 are both coupled to the reference voltage Vref. The offset controller 2210 may then perform the offset-calibration procedure discussed above to reduce the offset voltage of the voltage comparator 2220.

In the functional mode, the offset controller 2210 instructs the switch 2215 to couple the block voltage Vblk to the positive input of the voltage comparator 2220. The voltage comparator 2220 may then compare the block voltage Vblk with the reference voltage Vref, and generate the output signal Vblk_Hi based on the comparison, as discussed above. In the example shown in FIG. 22, the output signal Vblk_Hi is one if the block voltage is higher than the reference voltage, and zero if the block voltage is lower than the reference voltage.

Figure 23:
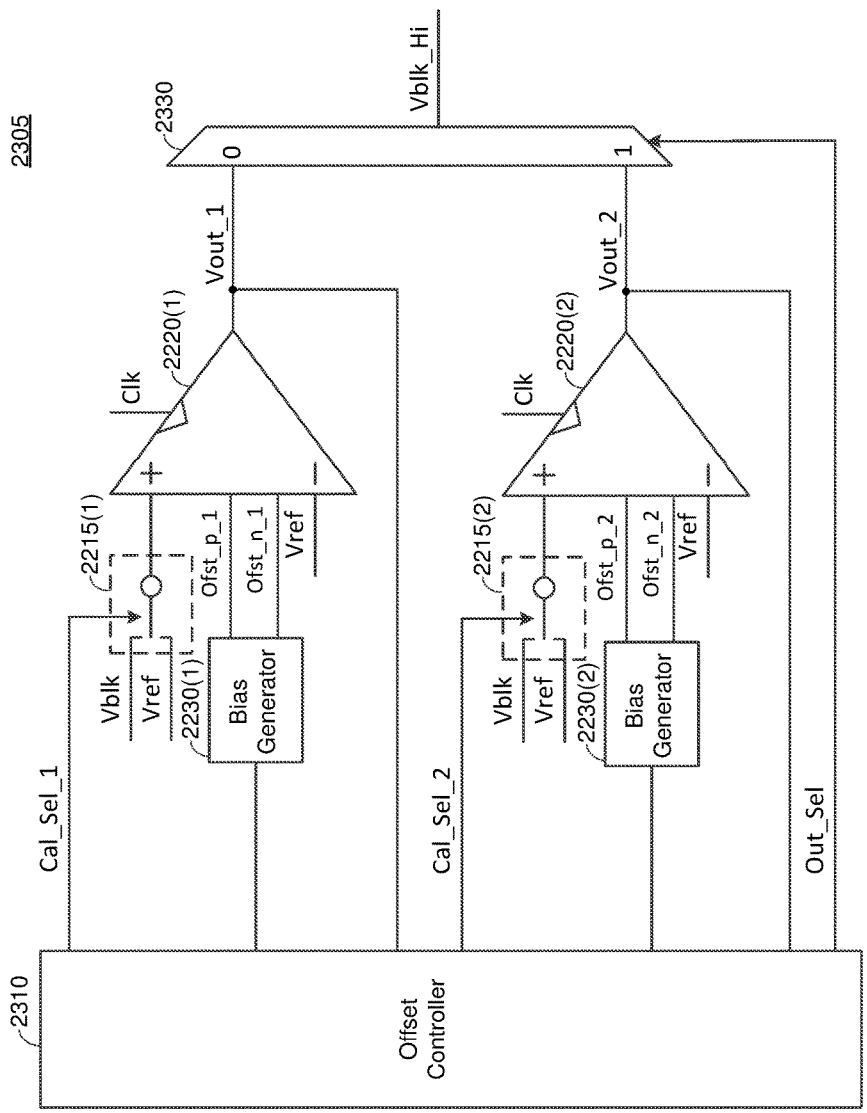
FIG. 23 shows an example of a voltage level comparator including two voltage comparators according to certain aspects of the present disclosure.

FIG. 23 shows an exemplary implementation of a voltage level comparator 2305 including first and second clocked voltage comparators 2220(1) and 2220(2) according to certain aspects of the present disclosure. In this example, one of the first and second clocked voltage comparators is used at a time to generate the output signal Vblk_Hi while the other one of the first and second clocked comparators 2220(1) and 2220(2) undergoes offset calibration, as discussed further below. The voltage level comparator 2305 may be used to implement the voltage level comparator 340 in the voltage regulator 310.

The voltage level comparator 2305 also includes an offset controller 2310, a first bias generator 2230(1), a second bias generator 2230(2), a first calibration switch 2215(1), a second calibration switch 2215(2), and a multiplexer 2330. In this example, each of the first and second voltage comparators 2220(1) and 2220(2) may be implemented as a separated instance (copy) of the clocked voltage comparator 1710 shown in FIG. 19, in which each of the first and the voltage comparator 2220(1) and 2220(2) includes respective compensation FETs 1922 and 1924.

The first bias generator 2230(1) is configured to generate the bias voltages Ofst_p_1 and Ofst_n_1 for the compensation FETs in the first voltage comparator 2220(1), and the second bias generator 2230(2) is configured to generate the bias voltages Ofst_p_2 and Ofst_n_2 for the compensation FETs in the second voltage comparator 2220(2). Each of the bias generators 2230(1) and 2230(2) may be implemented as a separate instance (copy) of the bias generator 1910 shown in FIG. 20.

The first calibration switch 2215(1) is coupled to the positive input of the first voltage comparator 2220(1), and is configured to selectively couple the block voltage Vblk or the reference voltage Vref to the positive input of the first voltage comparator 2220(1). The second calibration switch 2215(2) is coupled to the positive input of the second voltage comparator 2220(2), and is configured to selectively couple the block voltage Vblk or the reference voltage Vref to the positive input of the second voltage comparator 2220(2).

The negative input of the first voltage comparator 2220(1) is coupled to the reference voltage Vref, and the negative input of the second voltage comparator 2220(2) is coupled to the reference voltage Vref.

The multiplexer 2330 has a first input (denoted "0") coupled to the output Vout_1 of the first voltage comparator 2220(1), and a second input (denoted "1") coupled to the output Vout_2 of the second voltage comparator 2220(2). The multiplexer 2330 is configured to select one of the voltage comparators 2220(1) and 2220(2) at a time under the control of the offset controller 2310, and couple the output of the selected one of the voltage comparators 2220(1) and 2220(2) to the output of the multiplexer 2330. In this example, the output of the multiplexer 2330 provides the output signal Vblk_Hi of the level comparator 2305.

In operation, the offset controller 2310 may alternate between using the first voltage comparator 2220(1) to generate the output signal Vblk_Hi for the level comparator 2305 and using the second voltage comparator 2220(2) to generate the output signal Vblk_Hi for the level comparator 2305. When the first voltage comparator 2220(1) is used to generate the output signal Vblk_Hi, the second voltage comparator 2220(2) may undergo offset calibration, and vice versa.

When the first voltage comparator 2220(1) is used to generate the output signal Vblk_Hi, the offset controller 2310 instructs the multiplexer 2330 to select the first voltage comparator 2220(1). In this case, the output Vout_1 of the first voltage comparator 2220(1) is coupled to the output of the level comparator 2305. In addition, the offset controller 2310 instructs the first calibration switch 2215(1) to couple the block voltage Vblk to the positive input of the first voltage comparator 2220(1). In this case, the first voltage comparator 2220(1) compares the block voltage Vblk with the reference voltage Vref, and generates the output signal Vblk_Hi based on the comparison, as discussed above.

While the first voltage comparator 2220(1) is being used to generate the output signal Vblk_Hi, the offset controller 2310 may perform offset calibration for the second voltage comparator 2220(2). In this regard, the offset controller 2310 instructs the second calibration switch 2215(2) to couple the reference voltage Vref to the positive input of the second voltage comparator 2220(2). The offset controller 2310 may then perform the offset-calibration procedure discussed above to reduce the offset voltage of the second voltage comparator 2220(2). After offset calibration is complete for the second voltage comparator 2220(2), the offset controller 2310 may instruct the multiplexer 2330 to switch over to the second voltage comparator 2220(2) to use the second voltage comparator 2220(2) to generate the output signal Vblk_Hi.

When the second voltage comparator 2220(2) is used to generate the output signal Vblk_Hi, the offset controller 2310 instructs the multiplexer 2330 to select the second voltage comparator 2220(2). In this case, the output Vout_2 of the second voltage comparator 2220(2) is coupled to the output of the level comparator 2305. In addition, the offset controller 2310 instructs the second calibration switch 2215(2) to couple the block voltage Vblk to the positive input of the second voltage comparator 2220(2). In this case, the second voltage comparator 2220(2) compares the block voltage Vblk with the reference voltage Vref, and generates the output signal Vblk_Hi based on the comparison, as discussed above.

While the second voltage comparator 2220(2) is being used to generate the output signal Vblk_Hi, the offset controller 2310 may perform offset calibration for the first voltage comparator 2220(1). In this regard, the offset controller 2310 instructs the first calibration switch 2215(1) to couple the reference voltage Vref to the positive input of the first voltage comparator 2220(1). The offset controller 2310 may then perform the offset-calibration procedure discussed above to reduce the offset voltage of the first voltage comparator 2220(1). After offset calibration is complete for the first voltage comparator 2220(1), the offset controller 2310 may instruct the multiplexer 2330 to switch back over to the first voltage comparator 2220(1) to use the first voltage comparator 2220(1) to generate the output signal Vblk_Hi.

Figure 24:
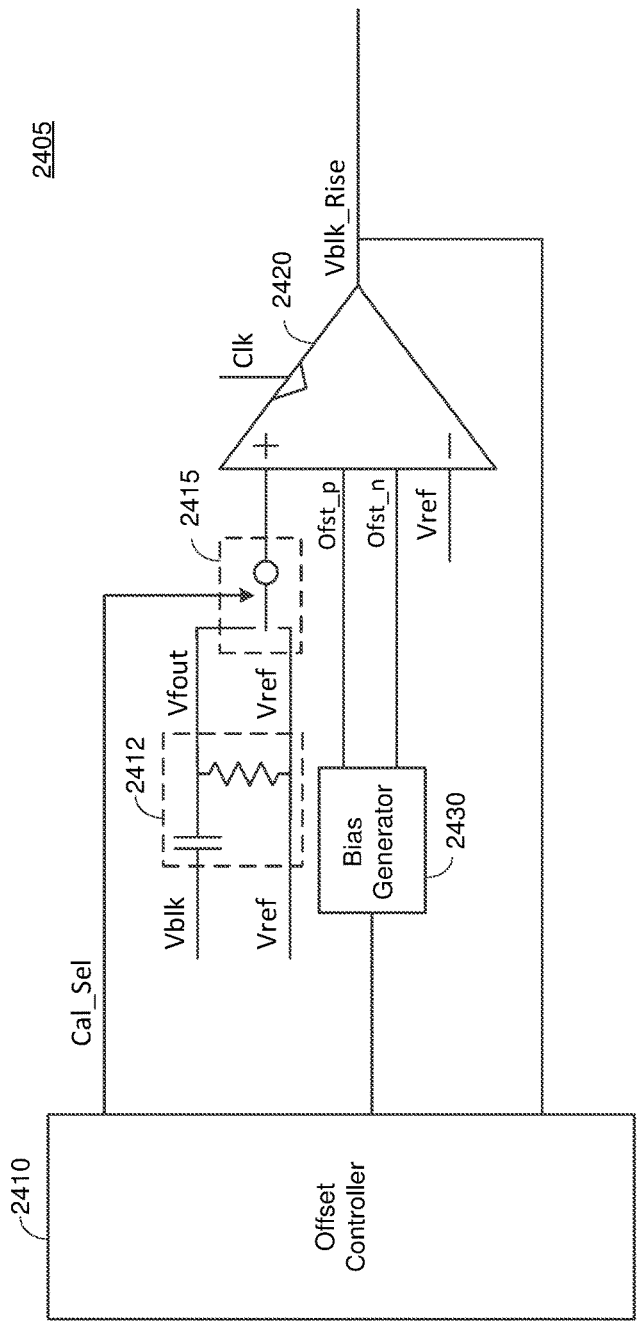
FIG. 24 shows an example of a slope detector with offset compensation according to certain aspects of the present disclosure.

FIG. 24 shows an exemplary implementation of a slope detector 2405 with offset compensation according to certain aspects of the present disclosure. The slope detector 2405 may be used to implement the slope detector 335 in the voltage regulator 310.

The slope detector 2405 includes a clocked voltage comparator 2420, an offset controller 2410, a bias generator 2430, a high-pass filter 2412, and a calibration switch 2415. The clocked voltage comparator 2420 may be implemented with the clocked voltage comparator 1710 shown in FIG. 19. In this example, the clocked voltage comparator 2420 includes the compensation FETs 1922 and 1924. The bias generator 2430 is configured to generate the bias voltages Ofst_p and Ofst_n for the compensation FETs 1922 and 1924 in the clocked voltage comparator 2420, and may be implemented with the bias generator 1910 shown in FIG. 20. The high-pass filter 2412 is configured to high-pass filter the block voltage Vblk to generate filtered output voltage Vfout, and may be implemented with the high-pass filter 1030 shown in FIG. 10. The offset controller 2410 is configured to adjust the bias voltages Ofst_p and Ofst_n using the bias generator 2430 during offset calibration to reduce the offset voltage of the voltage comparator 2420.

The calibration switch 2415 is coupled to the positive input of the voltage comparator 2220, and is configured to selectively couple the filtered output voltage Vfout or the reference voltage Vref to the positive input of the voltage comparator 2420. As discussed further below, during offset calibration, the offset controller 2410 instructs the switch 2415 to couple the reference voltage Vref to the positive input of the voltage comparator 2420 using control signal Cal_Sel. During normal operation, the offset controller 2410 instructs the switch 2415 to couple the filtered output voltage Vfout to the positive input of the voltage comparator 2420 using control signal Cal_Sel.

The negative input of the voltage comparator 2420 is coupled to the reference voltage Vref, and the output of the voltage comparator 2420 provides the output signal Vblk_Rise for the slope detector 2405. In this example, the negative input of the voltage comparator 2420 is coupled to the reference voltage Vref during both offset calibration and normal operation.

The offset controller 2210 is configured to operate in an offset-calibration mode or a functional mode. In the offset-calibration mode, the offset controller 2410 instructs the calibration switch 2215 to couple the reference voltage Vref to the positive input of the voltage comparator 2420. As a result, the positive and negative inputs of the voltage comparator 2420 are both coupled to the reference voltage Vref. The offset controller 2410 may then perform the offset-calibration procedure discussed above to reduce the offset voltage of the voltage comparator 2420.

In the functional mode, the offset controller 2410 instructs the switch 2415 to couple the filtered output voltage Vfout to the positive input of the voltage comparator 2420. The voltage comparator 2420 may then compare the filtered output voltage Vfout with the reference voltage Vref, and generate the output signal Vblk_Rise based on the comparison, as discussed above. In the example shown in FIG. 24, the output signal Vblk_Rise is one if the filtered output voltage is higher than the reference voltage, and zero if the filtered output voltage is lower than the reference voltage.

Figure 25:
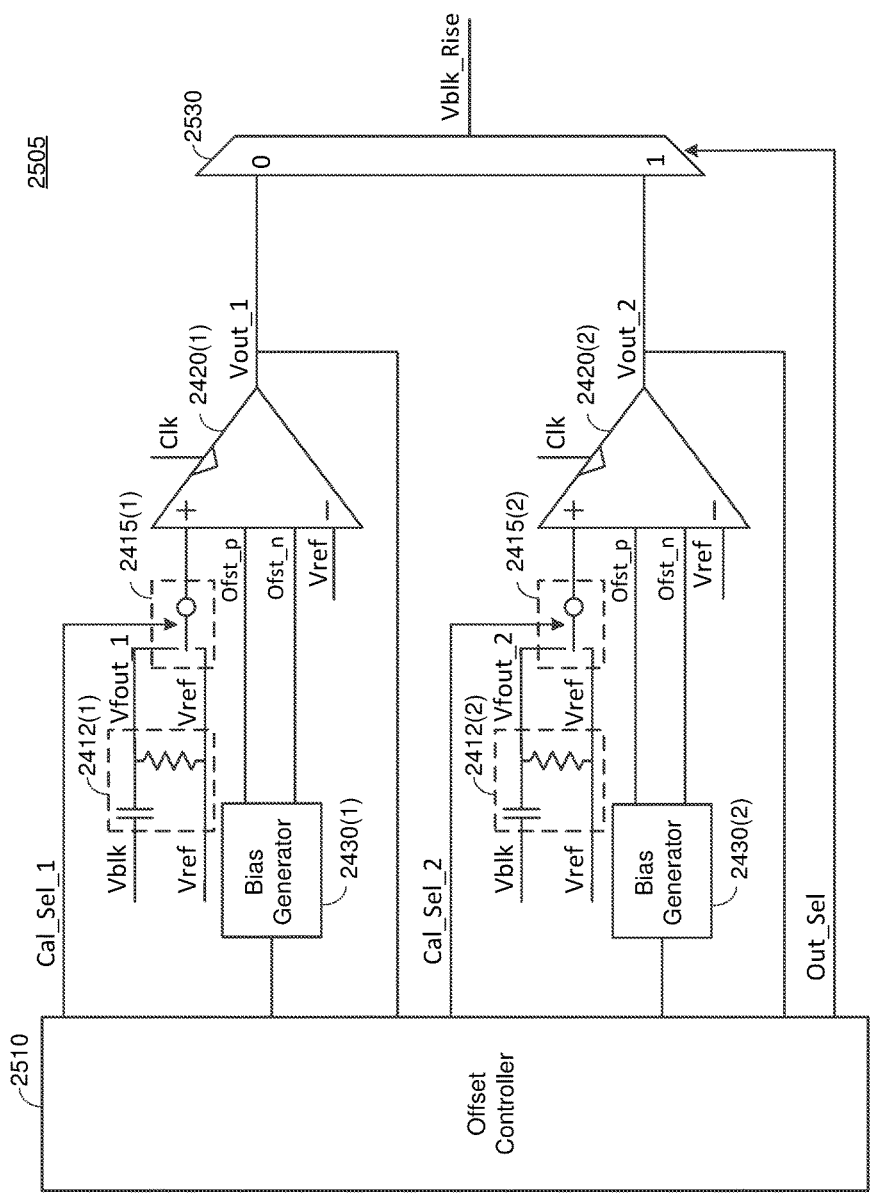
FIG. 25 shows an example of a slope detector including two voltage comparators according to certain aspects of the present disclosure.

FIG. 25 shows an exemplary implementation of a slope detector 2505 including first and second clocked voltage comparators 2420(1) and 2420(2) according to certain aspects of the present disclosure. In this example, one of the first and second clocked voltage comparators is used at a time to generate the output signal Vblk_Rise while the other one of the first and second clocked comparators 2420(1) and 2420(2) undergoes offset calibration, as discussed further below. The slope detector 2505 may be used to implement the slope detector 335 in the voltage regulator 310.

The slope detector 2505 also includes an offset controller 2510, a first bias generator 2430(1), a second bias generator 2430(2), a first high-pass filter 2412(1), a second high-pass filter 2412(2), a first calibration switch 2415(1), a second calibration switch 2415(2), and a multiplexer 2530. In this example, each of the first and second voltage comparators 2420(1) and 2420(2) may be implemented as a separated instance (copy) of the clocked voltage comparator 1710 shown in FIG. 19, in which each of the first and the voltage comparator 2420(1) and 2420(2) includes respective compensation FETs 1922 and 1924.

The first high-pass filter 2412(1) is configured to high-pass filter the block voltage Vblk to generate a first filtered output voltage Vfout_1, and the second high-pass filter 2412(2) is configured to high-pass filter the block voltage Vblk to generate a second filtered output voltage Vfout_2. Each of the high-pass filters may be implemented as a separate instance of the high-pass filter 1030 shown in FIG. 10.

The first bias generator 2430(1) is configured to generate the bias voltages Ofst_p_1 and Ofst_n_1 for the compensation FETs in the first voltage comparator 2420(1), and the second bias generator 2430(2) is configured to generate the bias voltages Ofst_p_2 and Ofst_n_2 for the compensation FETs in the second voltage comparator 2420(2). Each of the bias generators 2430(1) and 2430(2) may be implemented as a separate instance (copy) of the bias generator 1910 shown in FIG. 20.

The first calibration switch 2415(1) is coupled to the positive input of the first voltage comparator 2420(1), and is configured to selectively couple the first filtered output voltage Vfout_1 or the reference voltage Vref to the positive input of the first voltage comparator 2420(1). The second calibration switch 2415(2) is coupled to the positive input of the second voltage comparator 2420(2), and is configured to selectively couple the second filtered output voltage Vfout_2 or the reference voltage Vref to the positive input of the second voltage comparator 2420(2).

The negative input of the first voltage comparator 2420(1) is coupled to the reference voltage Vref, and the negative input of the second voltage comparator 2420(2) is coupled to the reference voltage Vref.

The multiplexer 2530 has a first input (denoted "0") coupled to the output Vout_1 of the first voltage comparator 2420(1), and a second input (denoted "1") coupled to the output Vout_2 of the second voltage comparator 2420(2). The multiplexer 2430 is configured to select one of the voltage comparators 2420(1) and 2420(2) at a time under the control of the offset controller 2510, and couple the output of the selected one of the voltage comparators 2420(1) and 2420(2) to the output of the multiplexer 2530. In this example, the output of the multiplexer 2530 provides the output signal Vblk_Rise of the slope detector 2505.

In operation, the offset controller 2510 may alternate between using the first voltage comparator 2420(1) to generate the output signal Vblk_Rise for the slope detector 2505 and using the second voltage comparator 2420(2) to generate the output signal Vblk_Rise for the slope detector 2505. When the first voltage comparator 2420(1) is used to generate the output signal Vblk_Rise, the second voltage comparator 2420(2) may undergo offset calibration, and vice versa.

When the first voltage comparator 2420(1) is used to generate the output signal Vblk_Rise, the offset controller 2510 instructs the multiplexer 2530 to select the first voltage comparator 2420(1). In this case, the output Vout_1 of the first voltage comparator 2420(1) is coupled to the output of the slope detector 2505. In addition, the offset controller 2510 instructs the first calibration switch 2415(1) to couple the first filtered output voltage Vfout_1 to the positive input of the first voltage comparator 2420(1). In this case, the first voltage comparator 2420(1) compares the first filtered output voltage Vfout_1 with the reference voltage Vref, and generates the output signal Vblk_Rise based on the comparison, as discussed above.

While the first voltage comparator 2420(1) is being used to generate the output signal Vblk_Rise, the offset controller 2510 may perform offset calibration for the second voltage comparator 2420(2). In this regard, the offset controller 2510 instructs the second calibration switch 2415(2) to couple the reference voltage Vref to the positive input of the second voltage comparator 2420(2). The offset controller 2510 may then perform the offset-calibration procedure discussed above to reduce the offset voltage of the second voltage comparator 2420(2). After offset calibration is complete for the second voltage comparator 2420(2), the offset controller 2510 may instruct the multiplexer 2530 to switch over to the second voltage comparator 2420(2) to use the second voltage comparator 2420(2) to generate the output signal Vblk_Rise.

When the second voltage comparator 2420(2) is used to generate the output signal Vblk_Rise, the offset controller 2510 instructs the multiplexer 2530 to select the second voltage comparator 2420(2). In this case, the output Vout_2 of the second voltage comparator 2420(2) is coupled to the output of the slope detector 2505. In addition, the offset controller 2510 instructs the second calibration switch 2415(2) to couple the second filtered output voltage Vfout_2 to the positive input of the second voltage comparator 2420(2). In this case, the second voltage comparator 2420(2) compares the second filtered output voltage Vfout_2 with the reference voltage Vref, and generates the output signal Vblk_Rise based on the comparison, as discussed above.

While the second voltage comparator 2420(2) is being used to generate the output signal Vblk_Rise, the offset controller 2510 may perform offset calibration for the first voltage comparator 2420(1). In this regard, the offset controller 2510 instructs the first calibration switch 2415(1) to couple the reference voltage Vref to the positive input of the first voltage comparator 2420(1). The offset controller 2510 may then perform the offset-calibration procedure discussed above to reduce the offset voltage of the first voltage comparator 2220(1). After offset calibration is complete for the first voltage comparator 2420(1), the offset controller 2510 may instruct the multiplexer 2530 to switch back over to the first voltage comparator 2420(1) to use the first voltage comparator 2420(1) to generate the output signal Vblk_Rise.

Figure 26:
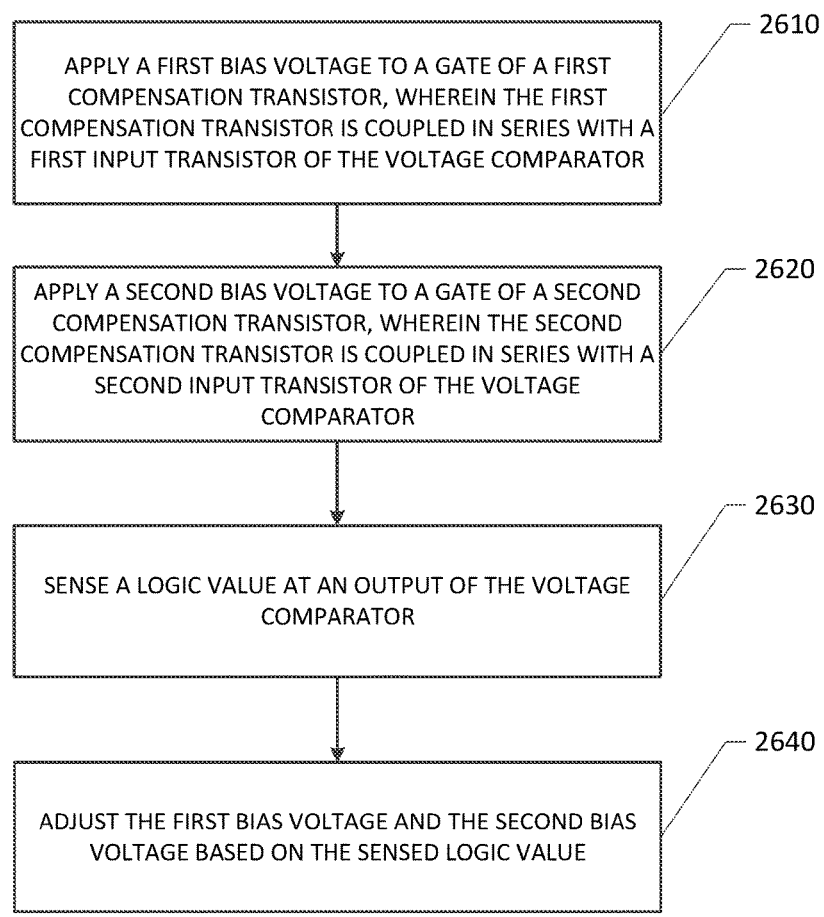
FIG. 26 is a flowchart illustrating a method for offset calibration according to certain aspects of the present disclosure.

FIG. 26 is a flowchart illustrating a method 2600 for offset calibration of a voltage comparator according to certain aspects of the present disclosure. The method may be performed by the offset-compensation system shown in FIG. 19.

At step 2610, a first bias voltage is applied to a gate of a first compensation transistor, wherein the first compensation transistor is coupled in series with a first input transistor of the voltage comparator. For example, the first compensation transistor may correspond to compensation FET 1922 or 1924, and the first input transistor may correspond to input FET 1722 or 1724.

At step 2620, a second bias voltage is applied to a gate of a second compensation transistor, wherein the second compensation transistor is coupled in series with a second input transistor of the voltage comparator. For example, the second compensation transistor may correspond to compensation FET 1922 or 1924, and the second input transistor may correspond to input FET 1722 or 1724.

At step 2630, a logic value at an output of the voltage comparator is sensed.

At step 2640, the first bias voltage and the second bias voltage are adjusted based on the sensed logic value. For example, adjusting the first bias voltage and the second bias voltage may include decreasing the first bias voltage and increasing the second bias voltage if the sensed logic value is one, and increasing the first bias voltage and decreasing the second bias voltage if the sensed logic value is zero. It is to be appreciated that the connections to the positive and negative inputs of the voltage comparators discussed above may be reversed without departing from the scope of the present disclosure. For example, it is to be appreciated that the positive input of the voltage comparator 910 may be coupled to the reference voltage Vref and the negative input of the voltage comparator 910 may be coupled to the block voltage Vblk. In this example, the output signal Vblk_Hi is zero when the block voltage Vblk is above the reference voltage Vref, and one when the block voltage Vblk is below the reference voltage Vref. In this case, the controller 350 may interpret a logic zero as the block voltage Vblk being above the reference voltage Vref, and a logic one as the block voltage Vblk being below the reference voltage Vref. In another example, it is to be appreciated that the positive input of the voltage comparator 1010 may be coupled to the reference voltage Vref and the negative input of the voltage comparator 1010 may be coupled to the filtered output voltage Vfout. In this example, the output signal Vblk_Rise is zero when the block voltage Vblk is rising, and one when the block voltage Vblk is falling. In this case, the controller 350 may interpret a logic zero as the block voltage Vblk rising, and a logic one as the block voltage Vblk being below.

Further, although aspects of the present disclosure were discussed above using the example of a positive polarity clocked comparator in which the input FETs are implemented with NFETs, it is to be appreciated that the present disclosure is not limited to this example. For example, aspects of the present disclosure also apply to a negative polarity clocked comparator. In this example, the exemplary input latch shown in FIG. 19 may be flipped vertically between the supply rail and ground, in which the NFETs shown in FIG. 19 may be implemented with PFETs, and vice versa. In this example, each of the reset FETs is coupled between the respective internal node or output and ground, and the sampling FET is coupled between the sources of the compensation FETs and the supply rail. In this example, the reset phase occurs when the clock signal Clk is high, and the evaluation phase occurs when the clock signal Clk is low. During the reset phase, the internal nodes and the outputs are reset to zero, and, during the evaluation phase, the sources of the compensation FETs are coupled to the supply rail. In this example, the output latch may be implemented with an NOR-gate based SR latch instead of the NAND-gate based SR latch shown in FIG. 18. This is because a NOR-gate based SR latch holds the current output logic value when both inputs to the NOR-gate based SR latch are zero, and the outputs of the input latch are reset to zero during the reset phase in this example. The positive polarity comparator may be used, for example, to compare voltages between half of Vrail and Vrail, and the negative polarity comparator may be used, for example, to compare voltages between ground and half of Vrail. In general, it to be appreciated that the offset compensation system according to aspects of the present disclosure is not limited to a particular comparator structure, and may be employed for different types of comparator structures in which compensation FETs are coupled in series with input FETs of the comparator to adjust the offset voltage of the comparator.

It is to be appreciated that the present disclosure is not limited to the exemplary terminology used above to describe aspects of the present disclosure. For example, the evaluation phase may also be referred to as the sampling phase, the integration phase or another term. In another example, the reset phase may also be referred to as the pre-charge phase or another term. In yet another example, the input FETs may also be referred to as driving FETs or another term.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The controller 350, the operational state manager 1210, the power manager 1220, and the offset controllers 1920, 2210, 2310, 2410 and 2510 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation.

It is to be understood that present disclosure is not limited to the specific order or hierarchy of steps in the methods disclosed herein. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for offset calibration of a voltage comparator, comprising:
    applying a first bias voltage to a gate of a first compensation transistor, wherein the first compensation transistor is coupled in series with a first input transistor of the voltage comparator;
    applying a second bias voltage to a gate of a second compensation transistor, wherein the second compensation transistor is coupled in series with a second input transistor of the voltage comparator;
    sensing a logic value at an output of the voltage comparator; and
    adjusting the first bias voltage and the second bias voltage based on the sensed logic value;
    wherein adjusting the first bias voltage comprises:
        decreasing the first bias voltage if the sensed logic value is one, wherein decreasing the first bias voltage comprises removing charge from a first bias capacitor coupled to the gate of the first compensation transistor; and
        increasing the first bias voltage if the sensed logic value is zero, wherein increasing the first bias voltage comprises adding charge to the first bias capacitor.

2. The method of claim 1, wherein adjusting the second bias voltage comprises:
    increasing the second bias voltage if the sensed logic value is one; and
    decreasing the second bias voltage if the sensed logic value is zero.

3. The method of claim 2, wherein a second bias capacitor is coupled to the gate of the second compensation transistor, increasing the second bias voltage comprises adding charge to the second bias capacitor, and decreasing the second bias voltage comprises removing charge from the second bias capacitor.

4. The method of claim 1, wherein a first voltage is coupled to a gate of the second input transistor, and the method further comprising:
    coupling the first voltage to a gate of the first input transistor in an offset-calibration mode; and
    coupling a second voltage to the gate of the first input transistor in a functional mode;
    wherein sensing the logic value at the output of the voltage comparator and adjusting the first bias voltage and the second bias voltage are performed in the offset-calibration mode.

5. The method of claim 4, wherein the first voltage is a reference voltage, and the second voltage is a block voltage at a block circuit or an output voltage of a high-pass filter.

6. The method of claim 1, further comprising:
    powering the voltage comparator with a supply voltage; and
    applying a reference voltage to a gate of the first input transistor and a gate of the second input transistor;
    wherein adjusting the first bias voltage comprises adjusting the first bias voltage within a voltage range, the voltage range being between the supply voltage and the reference voltage; and
    wherein adjusting the second bias voltage comprises adjusting the second bias voltage within the voltage range.

7. The method of claim 1, wherein adding charge to the first bias capacitor comprises:
    charging a storage capacitor; and
    after charging the storage capacitor, coupling the storage capacitor to the first bias capacitor.

8. The method of claim 7, wherein charging the storage capacitor comprises coupling the storage capacitor to a supply voltage rail.

9. The method of claim 7, wherein the storage capacitor has a smaller capacitance than the first bias capacitor.

10. An offset-compensation system, comprising:
    a first compensation transistor coupled in series with a first input transistor of a voltage comparator;
    a second compensation transistor coupled in series with a second input transistor of the voltage comparator;
    a bias generator configured to generate a first bias voltage and a second bias voltage, wherein the first bias voltage is applied to a gate of the first compensation transistor, and the second bias voltage is applied to a gate of the second compensation transistor; and
    an offset controller configured to sense a logic value at an output of the voltage comparator, and to instruct the bias generator to adjust the first bias voltage and the second bias voltage based on the sensed logic value, wherein the offset controller is configured to instruct the bias generator to adjust the first bias voltage by instructing the bias generator to decrease the first bias voltage if the sensed logic value is one, and instructing the bias generator to increase the first bias voltage if the sensed logic value is zero;

wherein the bias generator comprises:
   a first bias capacitor coupled to the gate of the first compensation transistor; and
   a charge control device configured to add charge to the first bias capacitor if the offset controller instructs the bias generator to increase the first bias voltage, and to remove charge from the first bias capacitor if the offset controller instructs the bias generator to decrease the first bias voltage.

11. The offset-compensation system of claim 10, wherein the offset controller is configured to instruct the bias generator to adjust the second bias voltage by instructing the bias generator to increase the second bias voltage if the sensed logic value is one, and instructing the bias generator to decrease the second bias voltage if the sensed logic value is zero.

12. The offset-compensation system of claim 11, wherein the bias generator further comprises
   a second bias capacitor coupled to the gate of the second compensation transistor,
   wherein the charge control device is configured to remove charge from the second bias capacitor if the offset controller instructs the bias generator to decrease the second bias voltage, and to add charge to the second bias capacitor if the offset controller instructs the bias generator to increase the second bias voltage.

13. The offset-compensation system of claim 10, further comprising:
   a switch configured to couple a first voltage or a second voltage to a gate of the first input transistor;
   wherein the first voltage is coupled to a gate of the second input transistor, and wherein the offset controller is configured to instruct the switch to couple the first voltage to the gate of the first input transistor in an offset-calibration mode, and to instruct the switch to couple the second voltage to the gate of the first input transistor in a functional mode.

14. The offset-compensation system of claim 13, wherein the offset-controller is configured to sense the logic value at the output of the voltage comparator and instruct the bias generator to adjust the first bias voltage and the second bias voltage in the offset-calibration mode.

15. The offset-compensation system of claim 14, wherein the first voltage is a reference voltage, and the second voltage is a block voltage at a block circuit or an output voltage of a high-pass filter.

16. The offset-compensation system of claim 10, wherein the charge control device comprises:
   a storage capacitor;
   a first switch between the storage capacitor and a supply voltage rail;
   a second switch between the storage capacitor and the first bias capacitor; and
   a switch controller configured to add charge to the first bias capacitor by:
     closing the first switch and opening the second switch to charge the storage capacitor; and
     after the storage capacitor is charged, opening the first switch and closing the second switch.

17. The offset-compensation system of claim 16, wherein the storage capacitor has a smaller capacitance than the first bias capacitor.

18. An offset-compensation system, comprising:
   a first compensation transistor coupled in series with a first input transistor of a voltage comparator;
   a second compensation transistor coupled in series with a second input transistor of the voltage comparator;
   a bias generator configured to generate a first bias voltage and a second bias voltage, wherein the first bias voltage is applied to a gate of the first compensation transistor, and the second bias voltage is applied to a gate of the second compensation transistor; and
   an offset controller, wherein for each one of multiple calibration steps, the offset controller is configured to:
     sense a logic value at an output of the voltage comparator;
     instruct the bias generator to decrease the first bias voltage and increase the second bias voltage if the sensed logic value for the calibration step is one; and
     instruct the bias generator to increase the first bias voltage and decrease the second bias voltage if the sensed logic value for the calibration step is zero;
   wherein the bias generator comprises:
     a first bias capacitor coupled to the gate of the first compensation transistor;
     a second bias capacitor coupled to the gate of the second compensation transistor; and
     a charge control device configured to add charge to the first bias capacitor and remove charge from the second bias capacitor if the offset controller instructs the bias generator to increase the first bias voltage and decrease the second bias voltage, and to remove charge from the first bias capacitor and add charge to the second bias capacitor if the offset controller instructs the bias generator to decrease the first bias voltage and increase the second bias voltage.

19. The offset-compensation system of claim 18, wherein the voltage comparator is powered by a supply voltage, and, for each one of the multiple calibration steps, the bias generator adjusts each of the first and second bias voltages by an amount equal to or less than 10 percent of the supply voltage.

20. The offset-compensation system of claim 18, wherein the offset controller is configured to instruct the bias generator to hold the first and second bias voltages after the logic value at the output of the voltage comparator toggles one or more times during one or more of the calibration steps.

21. The offset-compensation system of claim 18, wherein the charge control device comprises:
   a storage capacitor;
   a first switch between the storage capacitor and a supply voltage rail;
   a second switch between the storage capacitor and the first bias capacitor;
   a third switch between the storage capacitor and the second bias capacitor; and
   a switch controller configured to:
     close the first switch and open each of the second switch and the third switch to charge the storage capacitor; and
     after the storage capacitor is charged, close the second switch and open each of the first switch and the third switch if the offset controller instructs the bias generator to increase the first bias voltage; and
     after the storage capacitor is charged, close the third switch and open each of the first switch and the second switch if the offset controller instructs the bias generator to increase the second bias voltage.

22. The offset-compensation system of claim 21, wherein the storage capacitor has a smaller capacitance than each of the first bias capacitor and the second bias capacitor.

* * * * *